US012660149B2

(12) United States Patent
Wang et al.

(10) Patent No.: US 12,660,149 B2
(45) Date of Patent: Jun. 16, 2026

(54) INTERCONNECT STRUCTURES FOR INTEGRATION OF MEMORY CELLS AND LOGIC CELLS

(71) Applicant: Taiwan Semiconductor Manufacturing Company, Ltd., Hsin-Chu (TW)

(72) Inventors: Ping-Wei Wang, Hsin-Chu (TW); Feng-Ming Chang, Hsinchu County (TW); Jui-Lin Chen, Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 358 days.

(21) Appl. No.: 18/446,576

(22) Filed: Aug. 9, 2023

(65) Prior Publication Data

US 2024/0306362 A1 Sep. 12, 2024

Related U.S. Application Data

(60) Provisional application No. 63/489,217, filed on Mar. 9, 2023.

(51) Int. Cl.
H10B 10/00 (2023.01)
(52) U.S. Cl.
CPC ........... H10B 10/18 (2023.02); H10B 10/125 (2023.02)
(58) Field of Classification Search
CPC ...... H10B 10/18; H10B 10/125; H10B 10/12; H10D 89/10; H01L 23/5286; Y10S 257/904

USPC ......................................................... 257/773
See application file for complete search history.

(56) References Cited

U.S. PATENT DOCUMENTS

| | | | | |
|---|---|---|---|---|
| 7,706,172 | B2* | 4/2010 | Mayor | H10B 10/00 |
| | | | | 365/155 |
| 8,605,523 | B2 | 12/2013 | Tao et al. | |
| 8,630,132 | B2 | 1/2014 | Cheng et al. | |
| 8,760,948 | B2 | 6/2014 | Tao et al. | |
| 9,478,553 | B2* | 10/2016 | Liaw | H01L 23/5226 |
| 2002/0141233 | A1* | 10/2002 | Hosotani | H10B 61/10 |
| | | | | 365/158 |
| 2011/0222332 | A1* | 9/2011 | Liaw | H10B 10/12 |
| | | | | 365/156 |

(Continued)

FOREIGN PATENT DOCUMENTS

| | | |
|---|---|---|
| KR | 20190058369 A | 5/2019 |
| KR | 20220051884 A | 4/2022 |

(Continued)

*Primary Examiner* — Mohammad M Hoque
(74) *Attorney, Agent, or Firm* — HAYNES AND BOONE, LLP

(57) ABSTRACT

A semiconductor structure includes a memory cell, one or more logic cells configured to provide logic function to the memory cell, and an interconnect structure disposed over the memory cell and the one or more logic cells. The interconnect structure includes a bit line, a bit line bar, a first voltage line, and a second voltage line located in a same metal line layer of the interconnect structure. At least one of the bit line and the bit line bar extends from inside a boundary of the one or more logic cells and into a boundary of the memory cell. At least one of the first and second voltage lines extends from inside the boundary of the one or more logic cells and into the boundary of the memory cell.

20 Claims, 17 Drawing Sheets

(56) References Cited

U.S. PATENT DOCUMENTS

| | | | |
|---|---|---|---|
| 2011/0260218 A1 | 10/2011 | Ooka | |
| 2014/0032871 A1 | 1/2014 | Hsu et al. | |
| 2014/0078817 A1 | 3/2014 | Bentum | |
| 2014/0153321 A1 | 6/2014 | Liaw | |
| 2014/0153345 A1 | 6/2014 | Kim et al. | |
| 2014/0177352 A1 | 6/2014 | Lum | |
| 2014/0191328 A1* | 7/2014 | Tsuruta | H10B 10/18 |
| | | | 257/371 |
| 2014/0233330 A1 | 8/2014 | Ko et al. | |
| 2014/0241077 A1 | 8/2014 | Katoch et al. | |
| 2014/0269114 A1 | 9/2014 | Yang et al. | |
| 2020/0328216 A1* | 10/2020 | Liaw | H01L 23/53257 |
| 2020/0365207 A1 | 11/2020 | Huang | |
| 2020/0411063 A1 | 12/2020 | Fujiwara | |
| 2022/0122994 A1* | 4/2022 | Kim | H10D 30/43 |
| 2022/0262730 A1* | 8/2022 | Liaw | H10D 84/853 |

FOREIGN PATENT DOCUMENTS

| | | | |
|---|---|---|---|
| TW | 201701413 A | 1/2017 | |
| TW | 201818533 A | 5/2018 | |
| TW | 201822343 A | 6/2018 | |
| TW | 201921357 A | 6/2019 | |
| TW | 202240857 A | 10/2022 | |
| TW | 202303936 A | 1/2023 | |

* cited by examiner 30    45    40

SRAM cell | Logic cell
block | block

Transition Region

SRAM cells

WL landing pad

Logic cells

300

370

VSS landing pad

M0 Track 1
M0 Track 2
M0 Track 3
M0 Track 4
M0 Track 5

Bit line

CH

H

VSS landing pad

M0 Track 6

VDD line

M0 Track 7
M0 Track 8
M0 Track 9

Bit line bar

M0 Track 10

302b

302a

M0 Track 11
(M0 Track 1)

302d

302c

WL landing pad

M0 Track N+1

M0 Track 2N+1

⊗   V0

M0 metal line 30     45     40

SRAM cell | Logic cell
block | block

SRAM cells

WL landing pad

Transition Region

Logic cells

300

370

VSS landing pad

M0 Track 1
M0 Track 2
M0 Track 3
M0 Track 4
M0 Track 5

Bit line     Jog

Jog

CH

M0 Track 6

H

VSS landing pad

VDD line     Jog

M0 Track 7
M0 Track 8
M0 Track 9
M0 Track 10

Bit line bar

302b

302d

302a

302c

M0 Track 11
(M0 Track 1)

WL landing pad

M0 Track N+1

M0 Track 2N+1

⊗     V0
▭     M0 metal line

Y
↑
→ X 30  45  40

SRAM cell | Logic cell
block | block

SRAM cells

Logic cells

300

WL landing pad

Transition Region

370

VSS landing pad

H

VSS landing pad

Bit line

VDD line

Bit line bar

302b

302a

302d

302c

WL landing pad

M0 Track 1
M0 Track 2
M0 Track 3
M0 Track 4
M0 Track 5
M0 Track 6
M0 Track 7
M0 Track 8
M0 Track 9
M0 Track 10
M0 Track 11
(M0 Track 1)

CH

M0 Track N+1

M0 Track 2N+1

⊗  V0

▭  M0 metal line

Y
X

400

100

140
Two-port
SRAM Cell
Boundary 150D
160D
102
Write-port bit
line node

Write-port word
line node

Storage
node

170D

Read-port bit
line node 104
170A
160A
118

PG-2
120
170F
150A
R-PG

PD-2
Storage
node Bar
PU-2
160F
Read-port word
line node

116

VSS Node
150E
160E
150F 170G
160G

PD-1
160H
170H
VDD node

PU-1
114

Write-port word
line node
170E

Storage
node Bar 150C
160C
170C
112
Write-port bit
line node bar

160B

H

W

V0
CO
Gate
Active Region

Y ← X

INTERCONNECT STRUCTURES FOR INTEGRATION OF MEMORY CELLS AND LOGIC CELLS

PRIORITY DATA

This application claims priority to U.S. Provisional Patent Application No. 63/489,217 filed on Mar. 9, 2023, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Memories are commonly used in ICs. For example, a static random-access memory (SRAM) is a volatile memory used in electronic applications where high speed, low power consumption, and simplicity of operation are needed. Embedded SRAM is particularly popular in high-speed communications, image processing, and system-on-chip (SOC) applications. SRAM has the advantage of being able to hold data without requiring a refresh. An SRAM structure includes memory cells and logic cells. During IC design, designers retrieve the required cells from the cell libraries and position them in desired locations. Subsequently, routing is performed to establish connections between the memory cells and logic cells, creating the desired integrated circuit. For example, an SRAM structure generally includes multilayer interconnect structures providing metal tracks (metal lines) for interconnecting power lines and signal lines between the memory cells and logic cells. However, interconnect structures may consist of one set of metal tracks in the memory region and another set of metal tracks in the logic region, and the two sets of metal tracks are generally not aligned and thus not directly connected. Consequently, metal transitions to higher metal layers are needed to electrically connect the metal tracks in the memory region and the logic region. Such transitions increase resistance and capacitance in the interconnect structures, which presents performance, yield, and cost challenges. It has been observed that these higher resistances and/or higher capacitances exhibited by interconnects in advanced IC technology nodes can significantly delay (and, in some situations, prevent) signals from being routed efficiently to and from IC devices, such as transistors, negating any improvements in performance of such IC devices in the advanced technology nodes. Such transitions may be implemented in edge cells inserted between the memory region and the logic region, which also costs valuable real estate area on chip and increases manufacturing cost. Accordingly, although existing interconnect structures for memory-based ICs have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
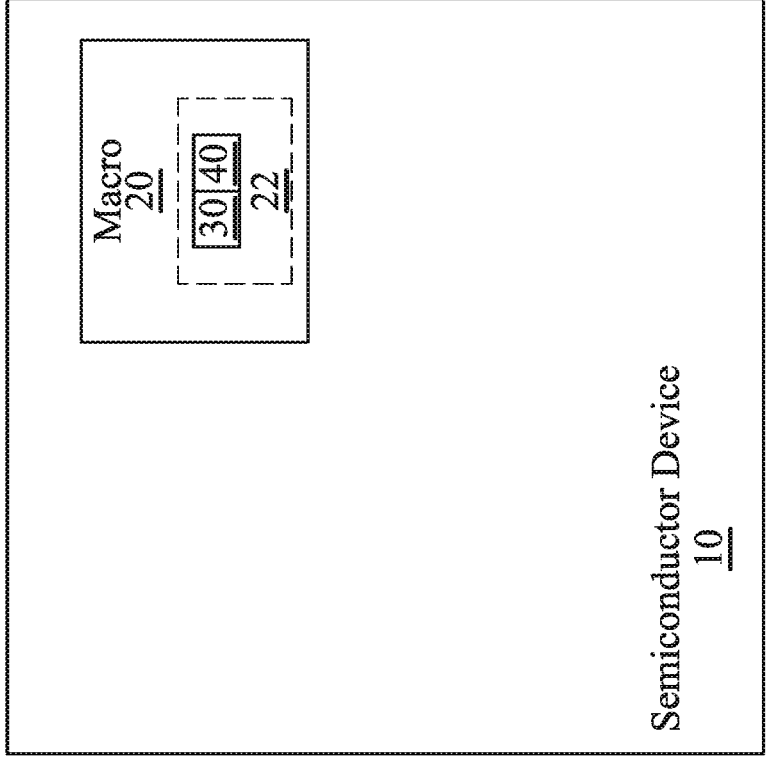
FIG. 1 illustrates a block diagram of a semiconductor device that includes a memory macro, in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally." "downwardly," "upwardly." etc.) are used for ease of the present disclosure of one features relationship to another feature. The spatially relative terms are intended to cover different orientations of the device including the features. Still further, when a number or a range of numbers is described with "about." "approximate." and the like, the term is intended to encompass numbers that are within +/−10% of the number described, unless otherwise specified. For example, the term "about 5 nm" encompasses the dimension range from 4.5 nm to 5.5 nm.

The present disclosure is generally related to static random-access memories (SRAM) structures including memory cells and logic cells. The memory cells are also referred to as bit cells, and are configured to store memory bits. The memory cells may be arranged in rows and columns of an array. The logic cells may be standard cells (STD cells), such as inverter (INV), AND, OR, NAND, NOR, Flip-flop, SCAN and so on. The logic cells are disposed around the memory cells, and are configured to implement various logic functions. Multilayer interconnect structures provide metal tracks (metal lines) for interconnecting power lines and signal lines between the memory cells and logic cells.

Reference now is made to FIG. 1. FIG. 1 is a simplified block diagram of a semiconductor device (or IC) 10, in accordance with some embodiments of the present disclosure. The semiconductor device 10 can be, e.g., a microprocessor, an application specific integrated circuit (ASIC), a field programmable gate array (FPGA), a digital signal processor (DSP), or a portion thereof, that includes various passive and active microelectronic devices such as resistors, capacitors, inductors, diodes, p-type field effect transistors (PFETs), n-type field effect transistors (NFETs), FinFET, gate-all-around (GAA) transistors (such as nanosheet FETs or nanowire FETs), other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. The exact functionality of the semiconductor device 10 is not a limitation to the provided subject matter.

The semiconductor device 10 includes a circuit macro (hereinafter, macro) 20. In some embodiments, the macro 20 is a static random-access memory (SRAM) macro, such as a single-port SRAM macro, a dual-port SRAM macro, or other types of SRAM macro. However, the present disclosure contemplates embodiments, where macro 20 is another type of memory, such as a dynamic random-access memory (DRAM), a non-volatile random access memory (NVRAM), a flash memory, or other suitable memory. FIG. 1 has been simplified for the sake of clarity to better understand the inventive concepts of the present disclosure. Additional features can be added in the macro 20, and some of the features described below can be replaced, modified, or eliminated in other embodiments of the macro 20.

In some embodiments, the macro 20 includes memory cells and peripheral circuits. The memory cells are also referred to as bit cells, and are configured to store memory bits. The peripheral cells are also referred to as logic cells that are disposed around the bit cells, and are configured to implement various logic functions. The logic functions of the logic cells include, for example, write and/or read decoding, word line selecting, bit line selecting, data driving and memory self-testing. The logic functions of the logic cells described above are given for the explanation purpose. Various logic functions of the logic cells are within the contemplated scope of the present disclosure. In the illustrated embodiment, the macro 20 includes a circuit region 22 in which at least a memory cell block 30 and at least a logic cell block 40 are positioned in close proximity to each other. The memory cell block 30 includes at least one memory cell. Generally, the memory cell block 30 may include many memory cells arranged in rows and columns of an array. The logic cell block 40 includes at least one logic cell. Generally, the logic cell block 40 may include many logic cells to provide read operations and/or write operations to the memory cells in the memory cell block 40. Transistors in the one or more memory cell blocks 30 and the one or more logic cell blocks 40 may be implemented with various PFETs and NFETs such as planar transistors or non-planar transistors including various FinFET transistors, GAA transistors, or a combination thereof. GAA transistors refer to transistors having gate electrodes surrounding transistor channels, such as vertically-stacked gate-all-around horizontal nanowire or nanosheet MOSFET devices. The following disclosure will continue with one or more GAA examples to illustrate various embodiments of the present disclosure. It is understood, however, that the application should not be limited to a particular type of device, except as specifically claimed. For example, aspects of the present disclosure may also apply to implementation based on FinFETs or planar FETs.

Figure 2:
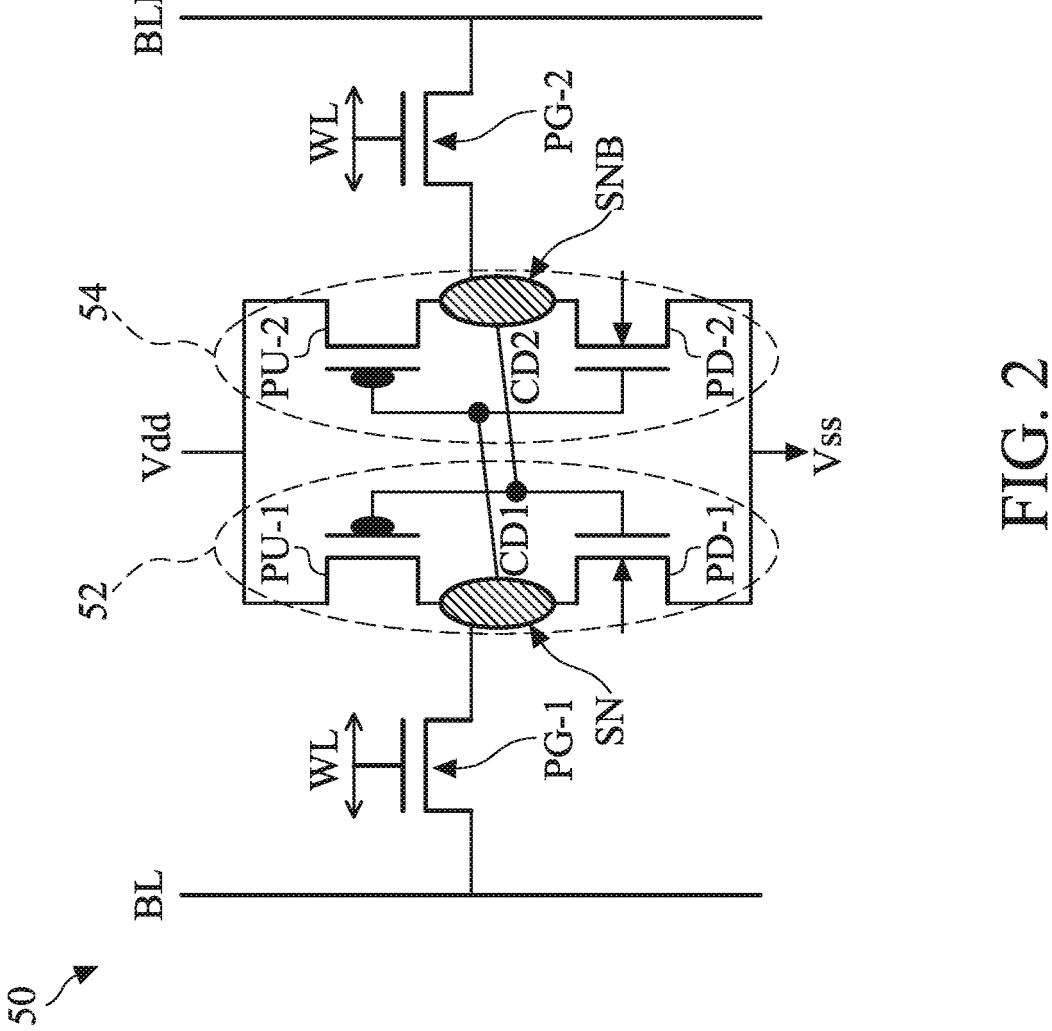
FIG. 2 illustrates a circuit schematic for a single-port static random-access memory (SRAM) cell, in accordance with some embodiments of the present disclosure.

FIG. 2 is a circuit diagram of an exemplary SRAM cell 50, which can be implemented as a memory cell of a SRAM array, according to various aspects of the present disclosure. In some implementations, SRAM cell 50 is implemented in one or more memory cell blocks 30 of the macro 20 (FIG. 1). In the illustrated embodiment, the SRAM cell 50 is a single-port (SP) six-transistor (6T) SRAM cell. In various embodiments, the SRAM cell 50 may be other types of memory cells, such as dual-port memory cell or a memory cell having more than six transistors. FIG. 2 has been simplified for the sake of clarity to better understand the inventive concepts of the present disclosure. Additional features can be added in single-port SRAM cell 50, and some of the features described below can be replaced, modified, or eliminated in other embodiments of single-port SRAM cell 50.

The exemplary SRAM cell 50 is a single port SRAM cell that includes six transistors: a pass-gate transistor PG-1, a pass-gate transistor PG-2, a pull-up transistor PU-1, a pull-up transistor PU-2, a pull-down transistor PD-1, and a pull-down transistor PD-2. In operation, the pass-gate transistor PG-1 and the pass-gate transistor PG-2 provide access to a storage portion of the SRAM cell 50, which includes a cross-coupled pair of inverters, an inverter 52 and an inverter 54. The inverter 52 includes the pull-up transistor PU-1 and the pull-down transistor PD-1, and the inverter 54 includes the pull-up transistor PU-2 and the pull-down transistor PD-2. In some implementations, the pull-up transistors PU-1, PU-2 are configured as p-type FinFET transistors or p-type GAA transistors, and the pull-down transistors PD-1, PD-2 are configured as n-type FinFET transistors or n-type GAA transistors.

A gate of the pull-up transistor PU-1 interposes a source (electrically coupled with a power supply voltage (VDD)) and a first common drain (CD1), and a gate of pull-down transistor PD-1 interposes a source (electrically coupled with a power supply voltage (VSS), which may be an electric ground) and the first common drain. A gate of pull-up transistor PU-2 interposes a source (electrically coupled with the power supply voltage (VDD)) and a second common drain (CD2), and a gate of pull-down transistor PD-2 interposes a source (electrically coupled with the power supply voltage (VSS)) and the second common drain. In some implementations, the first common drain (CD1) is a storage node (SN) that stores data in true form, and the second common drain (CD2) is a storage node (SNB) that stores data in complementary form. The gate of the pull-up transistor PU-1 and the gate of the pull-down transistor PD-1 are coupled with the second common drain (CD2), and the gate of the pull-up transistor PU-2 and the gate of the pull-down transistor PD-2 are coupled with the first common drain (CD1). A gate of the pass-gate transistor PG-1 interposes a source (electrically coupled with a bit line BL) and a drain, which is electrically coupled with the first common drain (CD1). A gate of the pass-gate transistor PG-2 interposes a source (electrically coupled with a complementary bit line BLB) and a drain, which is electrically coupled with the second common drain (CD2). In the context, the bit line BL and the complementary bit line BLB may also be collectively referred to as bit lines if not separately indicated. The gates of the pass-gate transistors PG-1, PG-2 are electrically coupled with a word line WL. In some implementations, the pass-gate transistors PG-1, PG-2 provide access to the storage nodes SN, SNB during read operations and/or write operations. For example, the pass-gate transistors PG-1, PG-2 couple the storage nodes SN, SNB respectively to the bit lines BL, BLB in response to a voltage applied to the gates of the pass-gate transistors PG-1, PG-2 by the word line WL.

Figure 3:
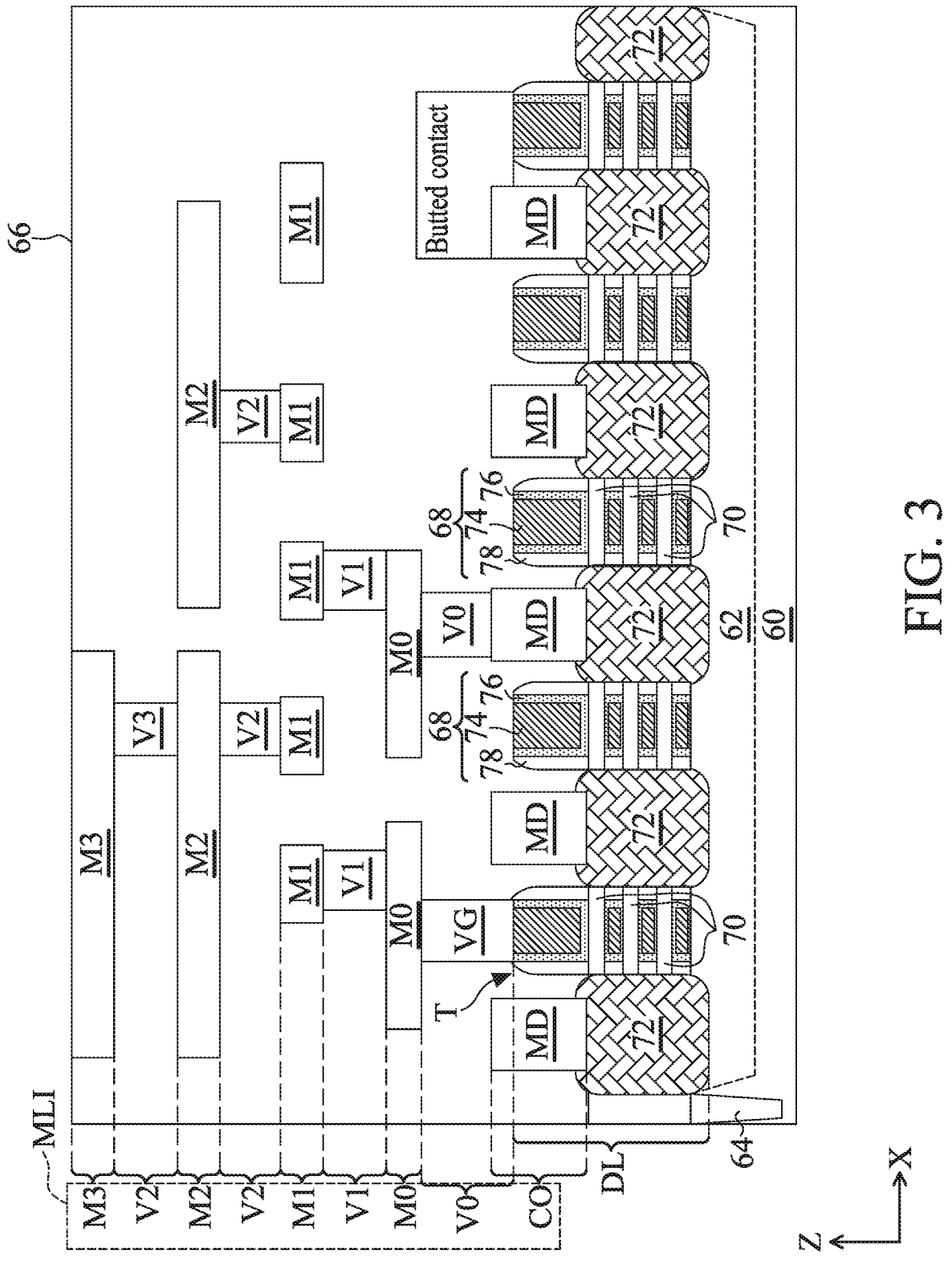
FIG. 3 illustrates a cross-sectional view of various layers of a memory device, in accordance with some embodiments of the present disclosure.
Figure 4:
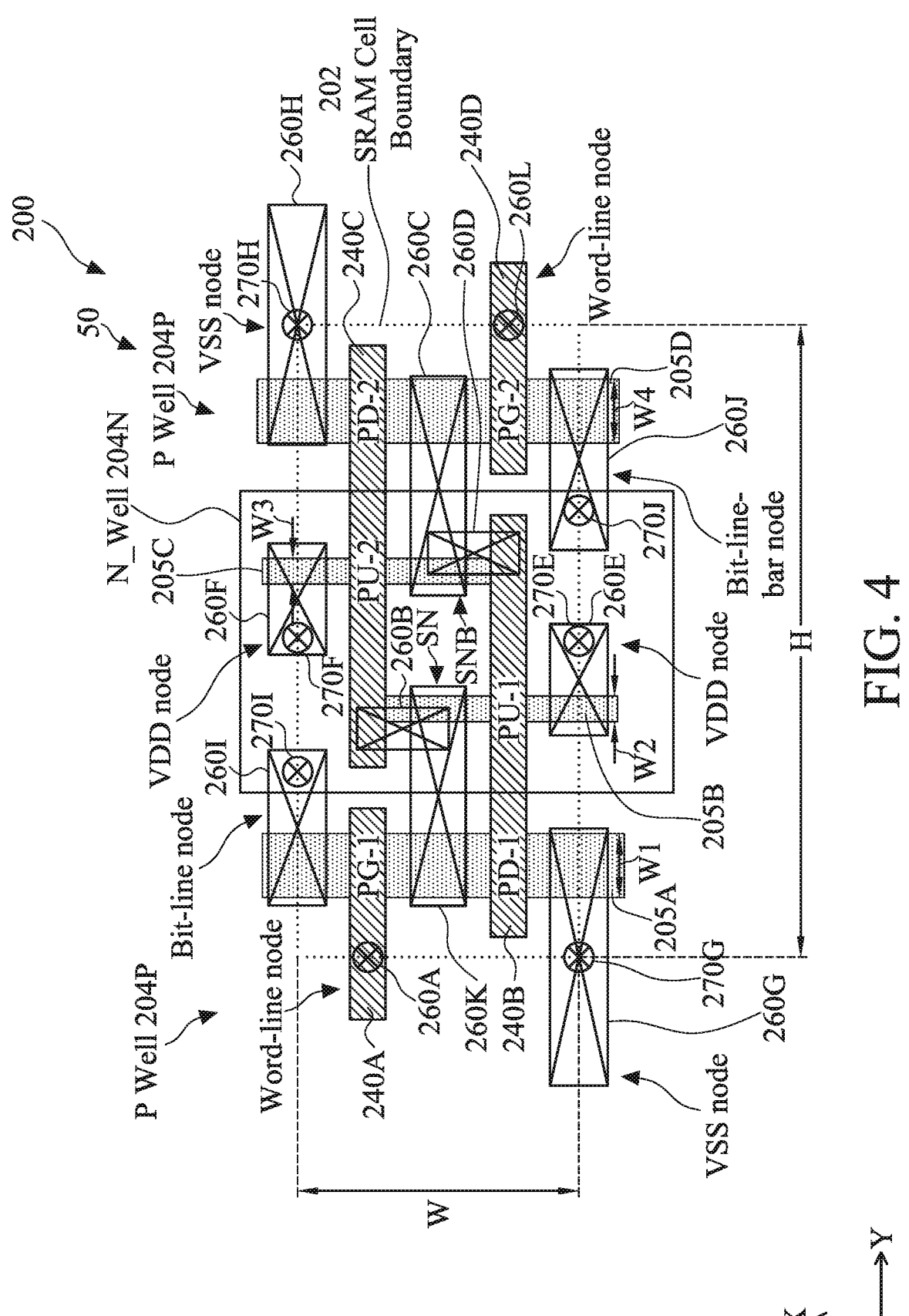
FIGS. 4 and 5 illustrates a layout including device layer and metal layer of the single-port SRAM cell as in FIG. 2, in accordance with some embodiments of the present disclosure.

FIG. 3 is a fragmentary diagrammatic cross-sectional view of various layers (levels) that can be fabricated over a semiconductor substrate (or wafer) 60 to form a portion of a memory, such as IC device 10 of FIG. 1, and/or a portion of an SRAM cell, such as SRAM cell 50 of FIG. 2, according to various aspects of the present disclosure. In FIG. 4, the various layers include a device layer DL and a multilayer interconnect MLI disposed over the device layer DL. Device layer DL includes devices (e.g., transistors, resistors, capacitors, and/or inductors) and/or device components (e.g., doped wells, gate structures, and/or source/drain features). In some embodiments, device layer DL includes substrate 60, doped regions 62 disposed in substrate 60 (e.g., n-wells and/or p-wells), isolation features 64, and transistors T. In the depicted embodiment, transistors T include suspended channel layers 70 and gate structures 68 disposed between source/drains 72, where gate structures 68 wrap and/or surround suspended channel layers 70. Each gate structure 68 has a metal gate stack formed from a gate electrode 74 disposed over a gate dielectric 76 and gate spacers 78 disposed along sidewalls of the metal gate stack. Multilayer interconnect MLI electrically couples various devices and/or components of device layer DL, such that the various devices and/or components can operate as specified by design requirements for the memory.

In the depicted embodiment, multilayer interconnect MLI includes a contact layer (C0 level), a via zero layer (V0 level), a metal zero (M0) level, a via one layer (V1 level), a metal one layer (M1 level), a via two layer (V2 level), a metal two layer (M2 level), a via three layer (V3 level), and a metal three layer (M3 level). The present disclosure contemplates multilayer interconnect MLI having more or less layers and/or levels, for example, a total number of N metal layers (levels) of the multilayer interconnect MLI with N as an integer ranging from 2 to 10. Each level of multilayer interconnect MLI includes conductive features (e.g., metal lines, metal vias, and/or metal contacts) disposed in one or more dielectric layers (e.g., an interlayer dielectric (ILD) layer and a contact etch stop layer (CESL)). In some embodiments, conductive features at a same level of multilayer interconnect MLI, such as M0 level, are formed simultaneously. In some embodiments, conductive features at a same level of multilayer interconnect MLI have top surfaces that are substantially planar with one another and/or bottom surfaces that are substantially planar with one another. C0 level includes source/drain contacts (MD) disposed in a dielectric layer 66; V0 level includes gate vias VG, source/drain contact vias VD, and butted contacts disposed in the dielectric layer 66; M0 level includes M0 metal lines disposed in dielectric layer 66, where gate vias VG connect gate structures to M0 metal lines, source/drain contact vias VD connect source/drains to M0 metal lines, and butted contacts connect gate structures and source/drains together and to M0 metal lines; V1 level includes V1 vias disposed in the dielectric layer 66, where V1 vias connect M0 metal lines to M1 metal lines; M1 level includes M1 metal lines disposed in the dielectric layer 66; V2 level includes V2 vias disposed in the dielectric layer 66, where V2 vias connect M1 lines to M2 lines; M2 level includes M2 metal lines disposed in the dielectric layer 66; V3 level includes V3 vias disposed in the dielectric layer 66, where V3 vias connect M2 lines to M3 lines. FIG. 3 has been simplified for the sake of clarity to better understand the inventive concepts of the present disclosure. Additional features can be added in the various layers of the memory, and some of the features described can be replaced, modified, or eliminated in other embodiments of the memory. FIG. 3 is merely an example and may not reflect an actual cross-sectional view of the IC device 10 and/or the SRAM cells 50 that is discussed in further detail below.

Figure 5:
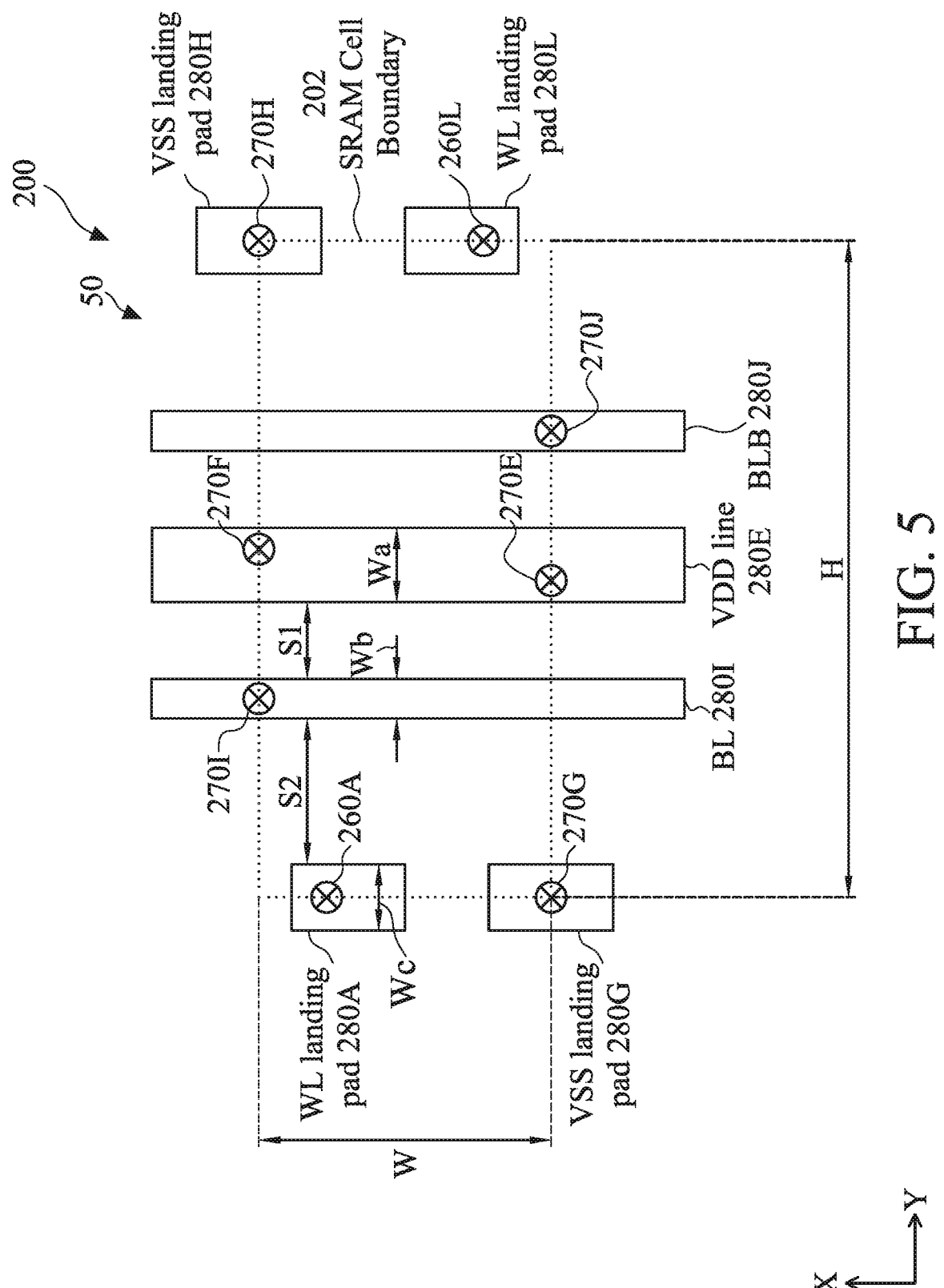

FIGS. 4 and 5 illustrate an exemplary layout 200 of the SRAM cell 50 as in FIG. 2, in which FIG. 4 illustrates the DL level, C0 level, and V0 level of the layout 200 and FIG. 5 illustrates V0 level and M0 level of the layout 200. The SRAM cell 50 has a cell boundary 202 represented by dotted lines in FIGS. 4 and 5. The cell boundary 202 is a rectangular box that is longer in the Y-direction than in the X-direction, for example, about 3.5 times to about 6 times longer. The first dimension of the cell boundary 202 along the X-direction is denoted as a cell width W, and the second dimension of the cell boundary 202 along the Y-direction is denoted as a cell height H. Where the SRAM cell 50 is repeated in a memory array, the cell width W may represent and be referred to as a memory cell pitch in the memory array along the X-direction, and the cell height H may represent and be referred to as a memory cell pitch in the memory array along the Y-direction. In the illustrated embodiment, the cell width W is two times a poly pitch. A poly pitch refers to a minimum center-to-center distance between two adjacent gate structures along the X-direction.

The SRAM cell 50 includes active regions 205 (including 205A, 205B, 205C, and 205D) that are oriented lengthwise along the X-direction, and gate structures 240 (including 240A, 240B, 240C and 240D) that are oriented lengthwise along the Y-direction perpendicular to the X-direction. The active regions 205B and 205C are disposed over an n-type well (or n-well) 204N. The active regions 205A and 205D are disposed over p-type wells (or p-wells) 204P that are on both sides of the n-well 204N along the Y-direction. The gate structures 240 engage the channel regions of the respective active regions 205 to form transistors. In that regard, the gate structure 240A engages the channel region of the active region 205A to form an n-type transistor as the pass-gate transistor PG-1; the gate structure 240B engages the channel region of the active region 205A to form an n-type transistor as the pull-down transistor PD-1 and engages the channel region of the active region 205B to form a p-type transistor as the pull-up transistor PU-1; the gate structure 240C engages the channel region of the active region 205D to form an n-type transistor as the pull-down transistor PD-2 and engages the channel region of the active region 205C to form a p-type transistor as the pull-up transistor PU-2; and the gate structure 240D engages the channel region of the active region 205D to form an n-type transistor as the pass-gate transistor PG-2. In the present embodiment, each of the channel regions is in the form of vertically-stacked nanostructures and each of the transistors PU-1, PU-2, PD-1, PD-2, PG-1, and PG-2 is a GAA transistor. Alternatively, each of the active regions 205 is in the form of a fin and each of the transistors PU-1, PU-2, PD-1, PD-2, PG-1, and PG-2 is a FinFET transistor.

Different active regions in different transistors of the SRAM cell 50 may have different widths (e.g., dimensions measured in the Y-direction) in order to optimize device performance. In more detail, the active region 205A of the pull-down transistor PD-1 and the pass-gate transistor PG-1 has a width W1, the active region 205B of the pull-up transistor PU-1 has a width W2, the active region 205C of the pull-up transistor PU-2 has a width W3, and the active region 205D of the pass-gate PG-2 and the pull-down transistor PD-2 has a width W4. The widths W1-W4 may also be measured in portions of the active regions corresponding to the channel regions. In other words, these portions of the active regions (from which the widths W1-W4 are measured) are the channel regions (e.g., the vertically-stacked nanostructures of GAA devices) of the transistors. To optimize SRAM performance, in some embodiments, either of the widths W1 and W4 is configured to be greater than either of the widths W2 and W3, as an effort to balance the speed among the n-type transistors and the p-type transistors. For example, a ratio of W1/W2 (or W4/W3) may range from about 1.2 to about 3. In furtherance of some embodiments, the widths W2 and W3 may be the same, and the widths W1 and W4 may be the same.

The SRAM cell 50 further includes conductive features in the C0 level, V0 level, M0 level, and even higher metal levels (e.g., M1 level, M2 level, etc.). A gate contact 260A electrically connects a gate of the pass-gate transistor PG-1 (formed by gate structure 240A) to a first word line WL landing pad 280A. The first WL landing pad 280A is electrically coupled to a word line WL located at a higher metal level. A gate contact 260L electrically connects a gate of the pass-gate transistor PG-2 (formed by gate structure 240D) to a second word line WL landing pad 280L. The second WL landing pad 280L is electrically coupled to a word line WL located at a higher metal level. An S/D contact 260K electrically connects a drain region of the pull-down transistor PD-1 (formed on the active region 205A (which may include n-type epitaxial source/drain features)) and a drain region of the pull-up transistor PU-1 (formed on the active region 205B (which may include p-type epitaxial source/drain features)), such that a common drain of pull-down transistor PD-1 and pull-up transistor PU-1 form a storage node SN. A gate contact 260B electrically connects a gate of the pull-up transistor PU-2 (formed by gate structure 240C) and a gate of the pull-down transistor PD-2 (also formed by gate structure 240C) to the storage node SN. The gate contact 260B may be a butted contact abutting the S/D contact 260K. An S/D contact 260C electrically connects a drain region of the pull-down transistor PD-2 (formed on the active region 205D (which may include n-type epitaxial source/drain features)) and a drain region of the pull-up transistor PU-2 (formed on the active region 205C (which may include p-type epitaxial source/drain features)), such that a common drain of pull-down transistor PD-2 and pull-up transistor PU-2 form a complementary storage node SNB. A gate contact 260D electrically connects a gate of the pull-up transistor PU-1 (formed by the gate structure 240B) and a gate of the pull-down transistor PD-1 (also formed by the gate structure 240B) to the complementary storage node SNB. The gate contact 260D may be a butted contact abutting the S/D contact 260C.

An S/D contact 260E and an S/D contact via 270E landing thereon electrically connect a source region of pull-up transistor PU-1 (formed on the active region 205B (which can include p-type epitaxial source/drain features)) to a VDD line 280E. The VDD line 280E is electrically coupled to a power supply voltage VDD. An S/D contact 260F and an S/D contact via 270F landing thereon electrically connect a source region of the pull-up transistor PU-2 (formed on the active region 205C (which may include p-type epitaxial source/drain features)) to the VDD line 280E. An S/D contact 260G and an S/D contact via 270G landing thereon electrically connect a source region of the pull-down transistor PD-1 (formed on the active region 205A (which may include n-type epitaxial source/drain features)) to a first VSS landing pad 280G. The first VSS landing pad 280G is electrically coupled to an electric ground VSS. An S/D contact 260H and an S/D contact via 270H landing thereon electrically connect a source region of the pull-down transistor PD-2 (formed on the active region 205D (which may include n-type epitaxial source/drain features)) to a second VSS landing pad 280H. The second VSS landing pad 280H is electrically coupled to an electric ground VSS. The S/D contact 260G and the S/D contact 260H may be device-level contacts that are shared by adjacent SRAM cells 100 (e.g., four SRAM cells 100 abutting at a same corner may share one S/D contact 260H). An S/D contact 260I and an S/D contact via 270I landing thereon electrically connect a source region of the pass-gate transistor PG-1 (formed on the active region 205A (which may include n-type epitaxial source/drain features)) to a bit line BL 280I. An S/D contact 260J and an S/D contact via 270J landing thereon electrically connect a source region of the pass-gate transistor PG-2 (formed on the active region 205D (which may include n-type epitaxial source/drain features)) to a complementary bit line (bit line bar) BLB 280J.

Conductive features in the C0 level, M0 level, and higher metal levels (e.g., M1 level, M2 layer, etc.) are routed along a first routing direction or a second routing direction that is different than the first routing direction. For example, the first routing direction is the X-direction (and substantially parallel with the lengthwise direction of active regions 205A-205D) and the second routing direction is the Y-direction (and substantially parallel with the lengthwise direction of gate structures 240A-240D). In the depicted embodiment, source/drain contacts (260C, 260E, 260F, 260G, 260H, 260I, 260J) have longitudinal (lengthwise) directions substantially along the Y-direction (i.e., second routing direction), and butted contacts (260B, 260D) have longitudinal directions substantially along the X-direction (i.e., first routing direction). Metal lines of even-numbered metal layers (i.e., M0 level and M2 level) are routed along the X-direction (i.e., the first routing direction) and metal lines of odd-numbered metal layers (i.e., M1 level and M3 level)

are routed along the Y-direction (i.e., the second routing direction). For example, in the M0 level as shown in FIG. 5, the bit line 280I, bit line bar 280J, VDD line 280E, VSS landing pad 280G, VSS landing pad 280H, word line landing pad 280A, word line landing pad 280L have longitudinal directions substantially along the X-direction. Further, since the metal lines in the same metal level (e.g., the M0 level) have the same longitudinal directions, the metal lines can be positioned in metal tracks arranged in parallel. A metal track may include one or more metal lines. For example, a metal track may include a single metal line that extends through the entire SRAM cell, or a metal track may include one or more local metal lines that do not extend through the entire SRAM cell. The illustrated metal lines are substantially rectangular-shaped (i.e., each has a length greater than its width), but the present disclosure contemplates metal lines having different shapes and/or combinations of shapes to optimize and/or improve performance (e.g., reduce resistance) and/or layout footprint (e.g., reduce density).

"Landing pad" generally refers to metal lines in metal layers that provide intermediate, local interconnection for the SRAM cell, such as (1) an intermediate, local interconnection between a device-level feature (e.g., gate or source/drain) and a bit line, a bit line bar, a word line, a voltage line or (2) an intermediate, local interconnection between bit lines, word lines, or voltage lines. For example, the VSS landing pad 280G is connected to source/drain contact 260G of the transistor PD-1 and further connected to a VSS line located in a higher metal level, the VSS landing pad 280H is connected to source/drain contact 260H of the transistor PD-2 and further connected to a VSS line located in a higher metal level, the WL landing pad 280A is connected to a gate of the transistor PG-1 and further connected to a word line WL located in a higher metal level, and the WL landing pad 280L is connected to a gate of the transistor PG-2 and further connected to a word line WL located in a higher metal level. Landing pads have longitudinal dimensions that are large enough to provide a sufficient landing area for their overlying vias (and thus minimize overlay issues and provide greater patterning flexibility). In the depicted embodiment, landing pads have longitudinal dimensions that are less than dimensions of the SRAM cell 50, such as dimensions along the X-direction that are less than cell width W and dimensions along the Y-direction that are less than cell height H. As a comparison to the landing pads, the bit line 280I, the bit line bar 280J, and the VDD line 280E have longitudinal dimensions along the X-direction that are greater than cell width W of the SRAM cell 50. As they travel through the entire SRAM cell 50 along the X-direction, the bit line 280I, the bit line bar 280J, and the VDD line 280E at the M0 level are also referred to as global metal lines, while others are referred to as local metal lines (including landing pads). In some embodiments, a length of each of the bit line 280I, the bit line bar 280J, and the VDD line 280E is sufficient to allow electrical connection of multiple SRAM cells in a column (or a row) to the respective global metal line.

The metal lines (global metal lines and local metal lines) in the SRAM cell 50 at the M0 level may have different widths. For example, the VDD line 280E has a width Wa, the bit line 280I and bit line bar 280J each have a width Wb, and the landing pads each have a width Wc, where the widths Wa and Wc each are wider than the width Wb. The widths Wa and Wc may substantially equal, alternatively, the width Wa may be larger than the width Wc. Having the largest width Wa reserved to the VDD line 280E allows the VDD line to generally benefit from a reduced resistance and thus a reduced voltage drop. Having the smallest width Wb reserved to the bit line 280I and bit line bar 280J allows the signal lines to generally benefit from a reduced parasitic capacitance and thus an improved response time. In some embodiments, a ratio of width Wa to width Wb (i.e., Wa:Wb) is about 1.1 to about 2. The spacing between the metal lines may not be the same. For example, the bit line 280I and the bit line bar 280J each are spaced from the VDD line for a distance S1, and the landing pads each are spaced from the closest signal line for a distance S2. In the illustrated embodiment, the distance S2 is larger than the distance S1. That is, the bit line 280I and the bit line bar 280J each are closer to the VDD line 280E in the Y-direction than to the landing pads. In some embodiments, a ratio of width S2 to width S1 (i.e., S2:S1) is about 1.1 to about 2. Alternatively, depending on the layout, the distance S2 may be smaller than the distance S1. Thus, in the alternative embodiments, the bit line 280I and the bit line bar 280J each may be closer to the landing pads in the Y-direction than to the VDD line 280E.

Figure 6:
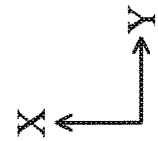
FIG. 6 illustrates a layout including a metal layer of a logic cell, in accordance with some embodiments of the present disclosure.

In some embodiments, the SRAM cell 50 is fabricated in the same memory macro (such as the macro 20 in FIG. 1) with a logic cell (often referred to as a standard cell). In such embodiments, metal lines in the M0 level of the SRAM cell 50 and metal lines in the M0 level of the logic cell can be configured to optimize both SRAM performance and logic density (co-optimization). For example, FIG. 6 is a layout 290 of metal lines in the M0 level of two logic cells arranged in the Y-direction, according to various aspects of the present disclosure. Each of the logic cell has a cell boundary 292 represented by dotted lines. The cell boundary 292 has a first dimension, such as a cell width CW, along a first direction (e.g., X-direction) and a second dimension, such as a cell height CH, along a second direction (e.g., Y-direction). In some embodiments, such as depicted, cell height CH is half of the SRAM cell height H, such that two logic cells abutting together have a total height 2*CH that is the same as the SRAM cell height H (i.e., H=2*CH).

The M0 level of the logic cells includes metal lines electrically connected to a device layer. The device layer of the logic cell includes transistors, such as NFETs and PFETs, each of which has a gate disposed between a source and a drain, where M0 level of the logic cells is electrically connected to at least one gate, at least one source, and/or at least one drain of the transistors. In some embodiments, gates of the transistors of the logic cells extend longitudinally along the same direction as gates in SRAM cell 50, and metal lines of M0 layer of the logic cell have a routing direction that is substantially perpendicular to the gate lengthwise direction. In some embodiments, the two abutting logic cells have a total of 2*N+1 (an odd number) metal lines arranged in the Y-direction, where N is an integer. In the illustrated embodiment, N equals 5, and the two abutting logic cells have eleven metal lines, namely metal lines 294-1 through 294-11. In various other embodiments, N may equal integers other than 5, such as 4 or 6. In some embodiments, the two abutting logic cells may functionally be considered as one logic cell having a cell height H and a cell width CW and having 2*N+1 metal lines.

As depicted, the metal lines at the M0 level are evenly distributed along the Y-direction with a spacing S0. The metal lines each may be arranged in a respective metal track. At the M0 level, the SRAM structure may include a plurality of metal tracks arranged in parallel (e.g., from Track 1 to Track 2*N+1). In the illustrated embodiment of the layout 290, the logic cells include eleven metal tracks arranged in order from first (M0 Track 1) to 11$^{th}$ (M0 Track 11) along the Y-direction. The center lines of the metal tracks are represented by the dashed lines in FIG. 6.

In the illustrated embodiment, the center metal track (the $(N+1)^{th}$ metal track, or the M0 Track 6 in FIG. 6) includes a metal line (e.g., the metal line 294-6 in FIG. 6) devoted as a VDD line. The metal track positioned as the second one away from the middle metal track (the $(N-1)^{th}$ metal track or the (N+3)th metal track, or the M0 Track 4 or the M0 Track 8 in FIG. 6) includes a metal line (e.g., the metal line 294-4 or the metal line 294-8 in FIG. 6) devoted to a signal line that is coupled to the SRAM cell 50, which is either a bit line BL or a bit line bar BLB. The meta tracks positioned as the first and the last metal tracks ($1^{st}$ and $(2*N+1)^{th}$ metal tracks, or the M0 Track 1 and the M0 Track 11 in FIG. 6) each include a metal line (e.g., the metal line 294-1 and the metal line 294-11 in FIG. 6) devoted as the VSS line.

Referring to FIGS. 5 and 6 collectively, to electrically connect the bit line 280I in the SRAM cell 50 and the bit line 294-4 in the first logic cell and to electrically connect the bit line bar 280J in the SRAM cell 50 and the bit line bar 294-8 in the second logic cell, one solution is to implement one or more edge cells positioned between the SRAM cell 50 and the logic cells. Inside the edge cells, metal transitions are provided to electrically couple meta lines at the M0 level to other metal lines in higher metal layers (e.g., M1 level and/or M2 level) to implement a bridge to connect the signal lines in the SRAM cell 50 and the logic cells. However, such metal transitions increase routing resistance and parasitic capacitance to the already resistance and capacitance sensitive signal lines, thereby undesirably increasing RC delay and decreasing SRAM speed, such as write/read speed. To be discussed in further detail below, another solution is to align the metal tracks (metal lines) in the SRAM cell 50 and the logic cells, which allows the signal lines to directly extend from the logic cells into the SRAM cell 50 without a need for extra metal transitions.

Figure 7:
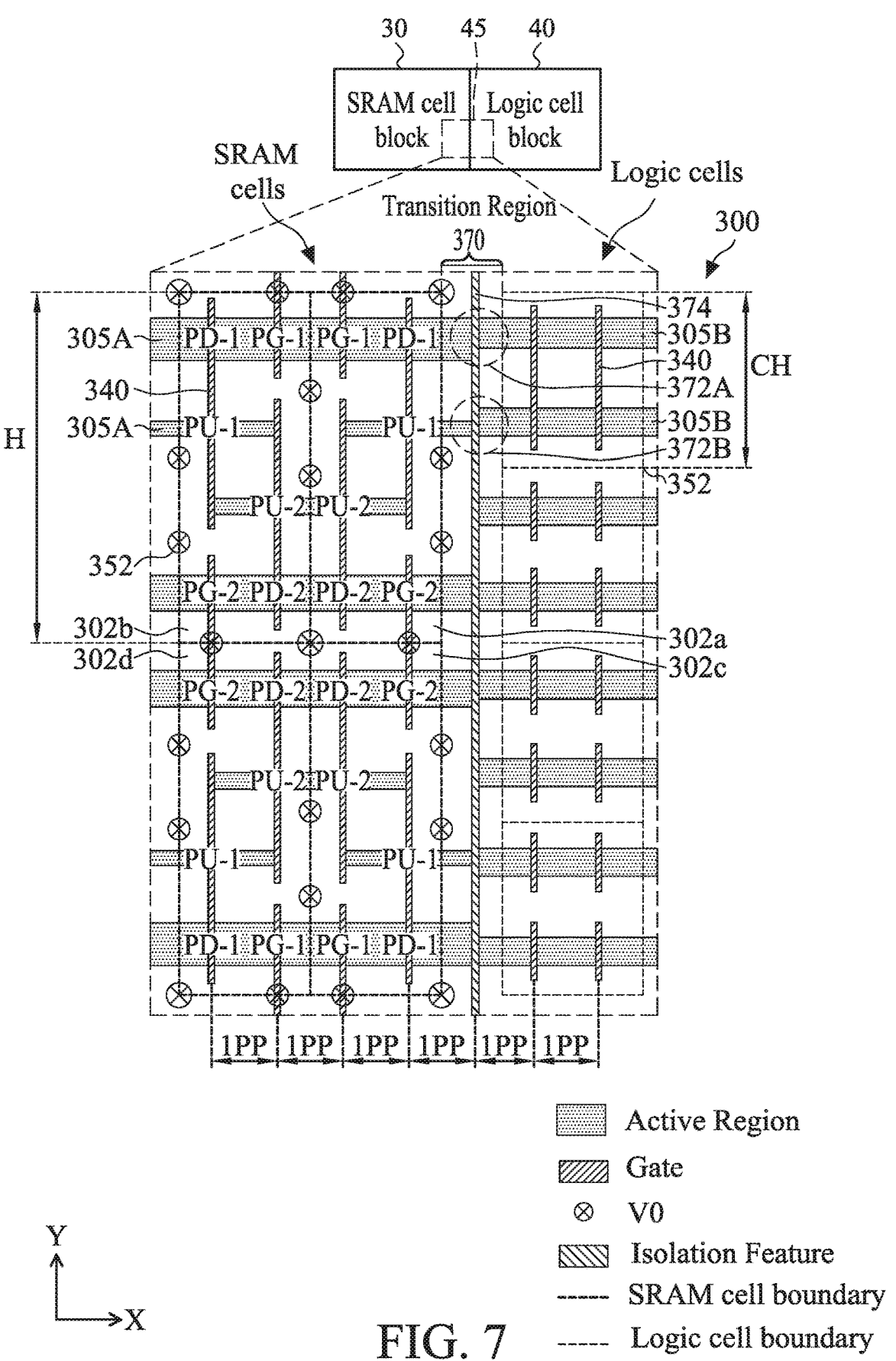
FIGS. 7, 8, 9, and 10 illustrate layouts of a portion of the memory macro as in FIG. 1, in accordance with some embodiments of the present disclosure.

FIG. 7 illustrates the DL level and V0 level of a layout 300 of a circuit region 45 in the macro 20 (FIG. 1), which includes a portion of the SRAM cell block 30 and a portion of the logic cell block 40 and extends across an interface between the SRAM cell block 30 and the logic cell block 40. FIG. 7 has been simplified for the sake of clarity to better understand the inventive concepts of the present disclosure. For example, active regions, gate structures, gate-cut isolation features, and vias at the V0 level in the SRAM cells are shown, while numerous other features are omitted in FIG. 7.

The circuit region 45 includes a first type of active regions 305A in the SRAM cell block 30 and a second type of active regions 305B in the logic cell block 40 (collectively as active regions 305). The active regions 305A are arranged along the Y-direction and oriented lengthwise in the X-direction. As discussed above, the active regions 305A may have different widths (e.g., W1-W4 in FIG. 4). The active regions 305B are arranged along the Y-direction and oriented lengthwise in the X-direction. In the illustrated embodiment, the active regions 305B are evenly distributed along the Y-direction and each have a uniform width. The circuit region 45 further includes gate structures 340 arranged along the X-direction and extending lengthwise in the Y-direction. In the illustrated embodiment, the gate structures 340 are evenly distributed along the X-direction with a uniform distance between two adjacent gate structures 340. The uniform distance is denoted as a gate pitch or a poly pitch ("PP"). The gate structures 340 intersect the active regions 305A, 305B in forming transistors. Transistors formed at the intersections of the active regions 305A and the gate structures 340 are within the SRAM cell block 30 and devoted to form SRAM cells. The transistors formed at the intersections of the active regions 305B and the gate structures 340 are within the logic cell block 40 and devoted to form logic cells.

In the illustrated embodiment, the transistors in the SRAM cell block 30 form a plurality of SRAM cells 302a, 302b, 302c, and 302d (collectively, SRAM cells 302). The SRAM cells 302 are arranged in the X-direction and the Y-direction, forming a 2×2 array of SRAM cells. Each SRAM cell 302 in the array may use the layout 200 of the SRAM cell 50 as depicted in FIG. 4. In some embodiments, two adjacent SRAM cells in the X-direction are line symmetric with respect to a common boundary therebetween, and two adjacent SRAM cells in the Y-direction are line symmetric with respect to a common boundary therebetween. That is, the SRAM cell 302b is a duplicate cell for the SRAM cell 302a but flipped over the Y-axis; the SRAM cell 302c is a duplicate cell for the SRAM cell 302a but flipped over the X-axis; and the SRAM cell 302d is a duplicate cell for the SRAM cell 302b but flipped over the X-axis.

Some active regions 305 extend through multiple SRAM cells in a row. For example, the active region for the transistors PD-1, PG-1 in the SRAM cell 302b extends through the SRAM cell 302a as the active region for its transistors PG-1, PD-1; the active region for the transistors PG-2, PD-2 in the SRAM cell 302b extends through the SRAM cell 302a as the active region for its transistors PD-2, PG-2; and the active region for the transistors PU-2 in the SRAM cell 302b extends into the SRAM cell 302a as the active region for its transistors PU-2. The active regions in the SRAM cells 302c, 302d are similarly arranged. The vias at the V0 level in the SRAM cells are also illustrated in FIG. 7.

In the illustrated embodiment, the transistors in the logic cell block 40 form a plurality of logic cells. The logic cells may be standard cells, such as inverter (INV), AND, OR, NAND, NOR, Flip-flop, SCAN and so on. The logic cells implement various logic functions to the SRAM cells 302. The logic functions of the logic cells include, for example, write and/or read decoding, word line selecting, bit line selecting, data driving and memory self-testing. As depicted, each logic cell has a logic cell height CH, which is half of the SRAM cell height H. Therefore, two logic cells have a boundary with opposing edges aligned with opposing edges of the boundary of one SRAM cell with the edges spaced in the Y-direction and each edge extending in the X-direction.

In the illustrated embodiment, the SRAM cell block 30 directly abuts the logic cell block 40 without edge cells therebetween. Between the opposing boundary lines of the SRAM cells in the SRAM cell block 30 and the logic cells in the logic cell block 40 is an active region transition region 370, or simply as the transition region. Inside the transition region 370, the active regions 305A extending from the edge column of the SRAM cells meet the active regions 305B extending from the edge column of the logic cells. Since a pair of the active regions 305A, 305B that meet may have different widths, a jog is created at where the active regions 305A, 305B meet. A jog refers to a junction where two segments of different widths meet each other. For example, in the region 372A represented by a dotted circle, a relatively wide active region 305A meets a relatively narrow active region 305B, creating a jog. The upper edges of the active regions 305A, 305B align, while the lower edges of the active regions 305A, 305B creates a step profile. Similarly, in the region 372B represented by another dotted circle, a relatively narrow active region 305A meets a relatively wide active region 305B, creating another jog. The lower edges of the active regions 305A, 305B align, while the upper edges of the active regions 305A, 305B creates a step profile.

As depicted in the layout 300, the transition region 370 has a span of one poly pitch between the opposing boundary lines of the SRAM cells and the logic cells along the X-direction. In the transition region 370, a dielectric feature (or isolation feature) 374 is oriented lengthwise in the Y-direction and provides isolation between the active regions 305A and 305B. The dielectric feature 374 overlaps with the jogs. In the exemplary layout 300, the dielectric feature 374 continuously extends along the boundary lines of the SRAM cells and the logic cells in the Y-direction. In other words, the dielectric feature 374 is taller the SRAM cell height H.

The dielectric feature 374 may be formed in a continuous-poly-on-diffusion-edge (CPODE) process. In a CPODE process, a polysilicon gate is replaced by a dielectric feature. For purposes of this disclosure, a "diffusion edge" may be equivalently referred to as an active edge, where for example an active edge abuts adjacent active regions. Before the CPODE process, the active edge may include a dummy GAA structure having a dummy gate structure (e.g., a polysilicon gate) and a plurality of vertically stacked nano-structures as channel layers. In addition, inner spacers may be disposed between adjacent nanostructures at lateral ends of the nanostructures. In various examples, source/drain epitaxial features are disposed on either side of the dummy GAA structure, such that the adjacent source/drain epitaxial features are in contact with the inner spacers and nanostruc-tures of the dummy GAA structure. The subsequent CPODE etching process removes the dummy gate structure and the channel layers from the dummy GAA structure to form a CPODE trench. The dielectric material filling a CPODE trench for isolation is referred to as a CPODE feature. In some embodiments, after the CPODE features are formed, the remaining dummy gate structures are replaced by metal gate structures in a replacement gate (gate-last) process. State differently, in some embodiments, the CPODE feature replaces a portion or full of the otherwise continuous gate structure and is confined between the opposing gate spacers of the replaced portion of the gate structure. The dielectric feature 374 is also referred to as a gate-cut feature or a CPODE feature. Since the CPODE feature 374 is formed by replacing the previously-formed polysilicon gate structures, the CPODE feature 374 inherits the arrangement of the gate structures 340. That is, the CPODE feature 374 may have the same width as the gate structures 340 and the same pitch as the gate structures 340.

Figure 8:
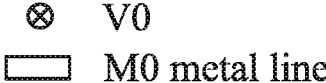
Figure 8:
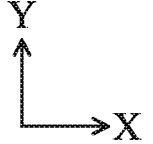

FIG. 8 illustrates the V0 level and M0 level of the layout 300 of the circuit region 45 in the macro 20 (FIG. 1), which includes a portion of the SRAM cell block 30 and a portion of the logic cell block 40 and extends across an interface between the SRAM cell block 30 and the logic cell block 40. At the M0 level, the logic cell block 40 includes a plurality of metal tracks arranged in parallel. Particularly, in the illustrated embodiment of the layout 300, two abutting logic cells include eleven metal tracks arranged in order from first (M0 Track 1) to eleventh (M0 Track 11) along the Y-direc-tion. The center lines of the metal tracks are represented by the dashed lines in FIG. 8.

The metal lines in the SRAM cells are aligned with the metal tracks in the logic cell block 40, allowing the metal lines in the logic cells to extend into the SRAM cells. Thus, there is no need for edge cells between the SRAM cell block 30 and the logic cell block 40 to provide metal transitions for the metal lines at the M0 level. In the M0 Track 1, a VSS line extends into the SRAM cell 302a and merges with the otherwise standing alone VSS landing pad. In the M0 Track 2, the metal line as a signal line in the logic cell remains in the boundary of the logic cell block 40. In the M0 Track 3, the metal line as a signal line in the logic cell remains in the boundary of the logic cell block 40. In the M0 Track 4, the metal line as the bit line in the logic cell also extends into and through the SRAM cells as a bit line for multiple SRAM cells in a row. In the M0 Track 5, the metal line as a signal line in the logic cell remains in the boundary of the logic cell block 40. In the M0 Track 6, the metal line as a VDD line in the logic cell also extends into and through the SRAM cells as a VDD line for multiple SRAM cells in a row. In the M0 Track 7, the metal line as a signal line in the logic cell remains in the boundary of the logic cell block 40. In the M0 Track 8, the metal line as the bit line bar in the logic cell also extends into and through the SRAM cells as a bit line bar for multiple SRAM cells in a row. In the M0 Track 9, the metal line as a signal line in the logic cell remains in the boundary of the logic cell block 40. In the M0 Track 10, the metal line as a signal line in the logic cell remains in the boundary of the logic cell block 40. In the M0 Track 11, the metal line as a VSS line in the logic cell may extend through the boundary of the logic cell block 40 but does not contact the word line WL landing pad.

In the illustrated embodiment, the metal lines in the metal tracks 4 and 8 extend from the logic cells and through the SRAM cells as a bit line and a bit line bar, respectively. Alternatively, depending on the layout, it may be the metal lines in the metal tracks 2 and 10, or the metal tracks 3 and 9, or the metal tracks 5 and 7 that extend from the logic cells and through the SRAM cells as a bit line and a bit line bar, respectively.

Generally, the boundary of an SRAM cell may directly abut the boundary of one or two logic cells. The one or two logic cells provide 2*N+1 metal tracks, where N is an integer. The metal line in the center metal track (the $(N+1)^{th}$ metal track) extends into the SRAM cell as a common VDD line for both the SRAM cell and the one or two logic cells. The two metal lines in the two metal tracks in equal spacing from the center metal track extend into the SRAM cell as a common bit line and a common bit line bar, respectively, for both the SRAM cell and the one or two logic cells. The two metal lines in the first and the $(2*N+1)^{th}$ metal tracks extend through the boundary of the one or two logic cells and connect to one of the VSS landing pads in the SRAM cell.

Figure 9:
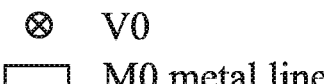
Figure 9:
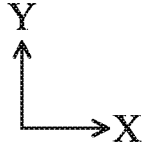

FIG. 9 illustrates an alternative embodiment of the layout 300 of the circuit region 45. For clarity and simplicity, similar features in the illustrated embodiments as shown in FIGS. 8 and 9 are identified by the same reference numerals, and such similar aspects are not repeated. One difference between the layouts 300 in FIGS. 8 and 9 is that the VDD line in FIG. 9 has jogs added. The jog portion of the VDD line has a larger width than other portion of the VDD line. The jog may add about 1% to about 50% extra width to the VDD line. The jogs are added to interconnection regions (areas) of the VDD line to increase cross-sectional areas of the interconnection regions, thereby reducing resistance of the VDD line. Increasing cross-sectional areas of the inter-connection regions of the VDD line allows for increasing cross-sectional areas of the source/drain vias in the V0 level that connect the VDD line to source/drain contacts (and thus to underlying source/drain regions).

Figure 10:
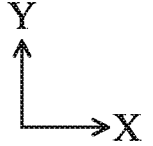

FIG. 10 illustrates an alternative embodiment of the layout 300 of the circuit region 45. For clarity and simplicity, similar features in the illustrated embodiments as shown in FIGS. 8 and 10 are identified by the same reference numer-als, and such similar aspects are not repeated. One difference between the layouts 300 in FIGS. 8 and 10 is that in FIG. 9 the metal lines in the M0 Track 2 and the M0 Track 10 also extend from the logic cells and through the SRAM cells. However, the metal lines in the M0 Track 2 and the M0 Track 10 are not functional metal lines for the SRAM cells, even though they are functional metal lines for the logic cells. The metal lines in the M0 Track 2 and the M0 Track 10 improve uniformity of the metal line density in the SRAM cell block 30. Further, the metal lines in the M0 Tracks 2, 4, 8, and 10 may be formed at the same time in a double patterning process, and to remove the metal lines in the M0 Track 2 and the M0 Track 10 separately may require an extra photolithography process and etching process, which increases manufacturing cost.

Figure 11:
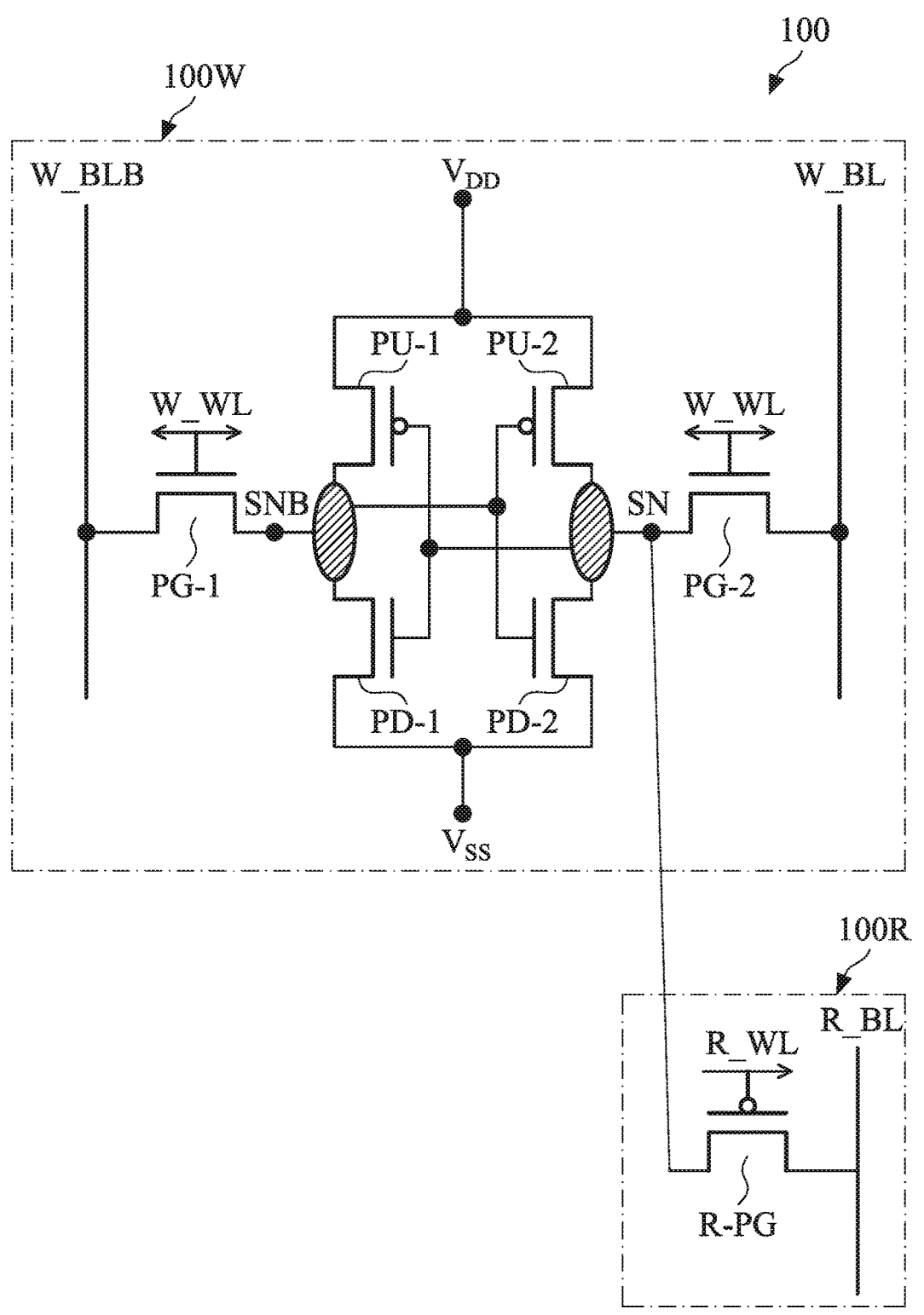
FIG. 11 illustrates a circuit schematic for a two-port SRAM cell, in accordance with some embodiments of the present disclosure.

Although the exemplary SRAM cell 50 is a single-port SRAM cell, the alignment of signal lines and power lines in the SRAM cells and logic cells can also be applied to multi-port SRAM cells. Further, the exemplary single-port SRAM cell and/or multi-port SRAM cell may include various number of transistors to meet the performance needs, such as including six transistors (6T), seven transistors (7T), eight transistors (8T), ten transistors (10T), or even more. FIG. 11 illustrates an example circuit schematic for a two-port SRAM cell 100 that includes seven transistors (7T). The two-port SRAM cell 100 includes a write-port 100W and a read-port 100R. The write-port 100W includes pull-up transistors PU-1, PU-2, pull-down transistors PD-1, PD-2, and pass-gate transistors PG-1, PG-2. In the illustrated embodiment, transistors PU-1 and PU-2 are p-type transistors, and transistors PG-1, PG-2, PD-1, and PD-2 are n-type transistors.

The drains of the pull-up transistor PU-1 and the pull-down transistor PD-1 are coupled together, and the drains of the pull-up transistor PU-2 and the pull-down transistor PD-2 are coupled together. The transistors PU-1 and PD-1 are cross-coupled with the transistors PU-2 and PD-2 to form a data latch. The gates of the transistors PU-1 and PD-1 are coupled together and to the common drains of the transistors PU-2 and PD-2 to form a storage node SN, and the gates of the transistors PU-2 and PD-2 are coupled together and to the common drains of the transistors PU-1 and PD-1 to form a complementary storage node SNB. Sources of the pull-up transistors PU-1 and PU-2 are coupled to a power voltage VDD, and the sources of the pull-down transistors PD-1 and PD-2 are coupled to a voltage VSS, which may be an electrical ground in some embodiments.

The storage node SN of the data latch is coupled to a bit line W_BL of the write-port 100W through the pass-gate transistor PG-2, and the complementary storage node SNB is coupled to a complementary bit line W_BLB of the write-port 100W through the pass-gate transistor PG-1. The storage node SN and the complementary storage node SNB are complementary nodes that are often at opposite logic levels (logic high or logic low). Gates of the pass-gate transistors PG-1 and PG-2 are coupled to a word line W_WL of the write-port 100W.

The read-port 100R of the SRAM cell 100 includes a read-port pass-gate transistor (R-PG) coupled between the bit line R_BL and the storage node SN (or to the gates of the transistors PU-1 and PD-1). The gate of the read-port pass-gate transistor R-PG is coupled to a word line R_WL of the read-port 100R. In the illustrated embodiment, the transistor R-PG is a p-type transistor. That is, in the two-port SRAM cell 100, the pass-gate transistors in a write-port are n-type transistors, and the pass-gate transistor in a read-port is a p-type transistor.

Figure 12:
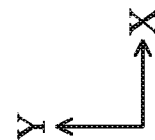
FIGS. 12 and 13 illustrates a layout including device layer and metal layer of the two-port SRAM cell as in FIG. 11, in accordance with some embodiments of the present disclosure.
Figure 13:
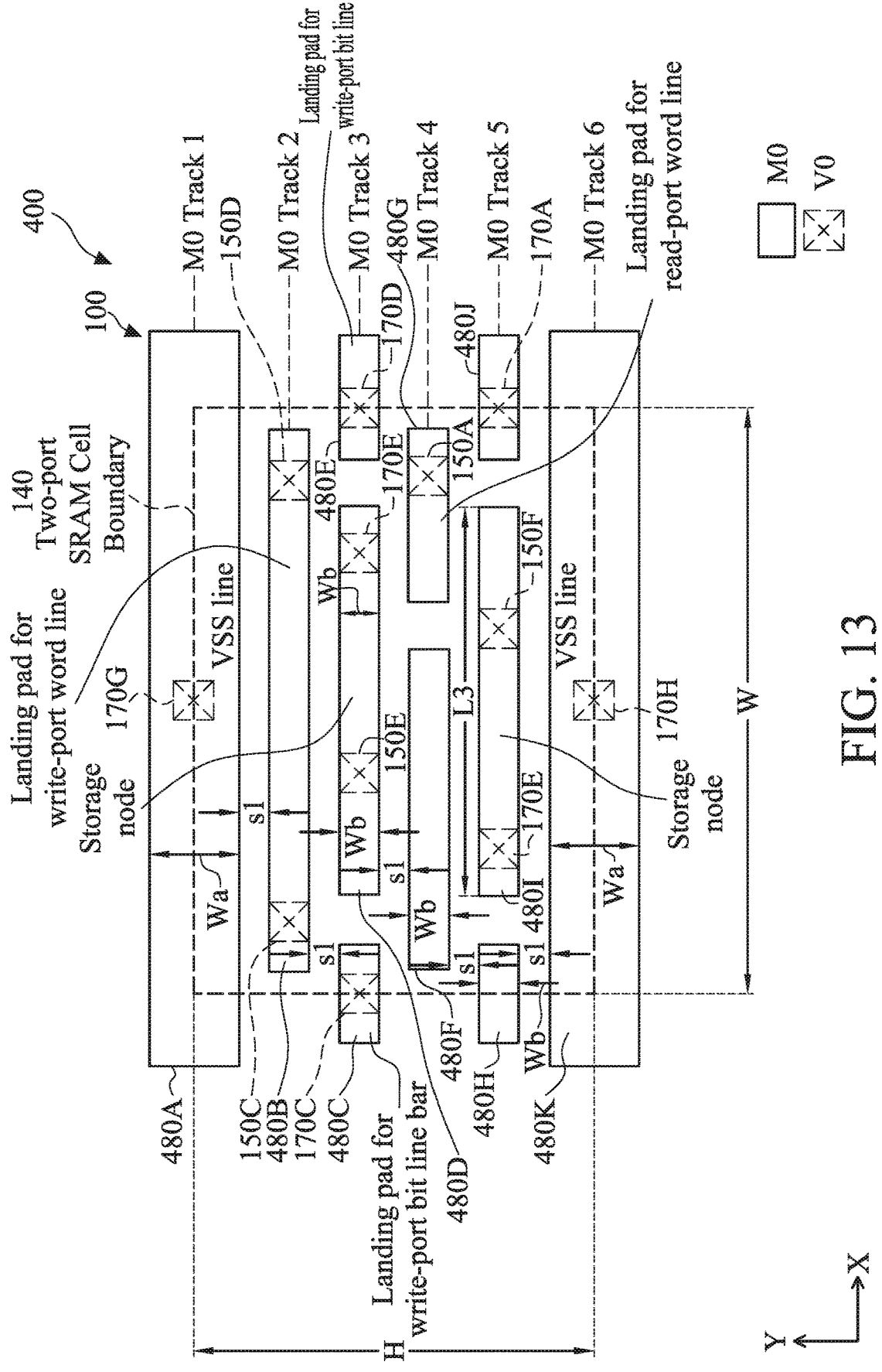

FIGS. 12 and 13 illustrate an exemplary layout 400 of the SRAM cell 100 as in FIG. 11, in which FIG. 12 illustrates the DL level, C0 level, and V0 level of the layout 400 and FIG. 13 illustrates V0 level and M0 level of the layout 400. The two-port SRAM cell 100 includes active regions 102 and 104. The active regions 102, 104 each extend lengthwise in the X-direction in FIG. 12. The active region 102 are a components of the write-port 100W, and the active region 104 has a side portion as a component of the read-port 100R and rest portion as a component of the write-port 100W. In other words, the active region 104 is shared by the read-port 100R and the write-port 100W. In the illustrated embodiment, the active region 104 belong to the transistors PU-1, PU-2, R-PG, which are PMOS devices. As such, the active region 104 is formed over an n-well. Meanwhile, the active region 102 belongs to the transistors PG-1, PD-1, PD-2, PG-2, which are NMOS devices. As such, the active region 102 is formed over a p-well (or a p-type substrate).

The two-port SRAM cell 100 further includes gate structures 112, 114, 116, 118, and 120. The gate structures 112-120 each extend lengthwise in the Y-direction. The gate structures 112, 114, 116, and 120 are components of the write-port 100W. The gate structure 118 is a component of the read-port 100R. The gate structures 114, 116 each extend through the two active regions 102, 104. As such, the gate structure 114 is shared by the transistors PD-1 and PU-1, and the gate structure 116 is shared by the transistors PD-2 and PU-2.

A boundary 140 of the two-port SRAM cell 100 is illustrated using broken lines. Note that some of the active regions and gate structures may extend beyond the illustrated boundary 140, since these active regions and gate structures may also form components of other adjacently located SRAM cells as well. The boundary 140 is longer in the X-direction than in the Y-direction. In other words, the boundary 140 may be rectangular. The first dimension of the boundary 140 along the X-direction is denoted as a cell width W, and the second dimension of the boundary 140 along the Y-direction is denoted as a cell height H. Where the two-port SRAM cell 100 is repeated in a memory array, the cell width W may represent and be referred to as a memory cell pitch in the memory array along the X-direction, and the cell height H may represent and be referred to as a memory cell pitch in the memory array along the Y-direction.

The cell size of the two-port SRAM cell 100 is W×H, in which the cell width W is about 4 times a poly pitch (e.g., a center-to-center distance between two adjacent gate structures along the X-direction) and the cell heigh H is about 2 times an isolation pitch (e.g., a center-to-center distance between two adjacent STI features along the Y-direction). Denoting an area of one poly pitch times one isolation pitch as a unit area, each unit area includes an intersection of a gate structure and an active region, and the two-port SRAM cell 100 utilizes a cell size of about 8 times a unit area in accommodating the seven transistors, namely the transistors PG-1, PG-2, PU-1, PU-2, PD-1, PD-2, and R-PG. The area utilization at the device layer of the SRAM cell 100 is considered efficient as there is only one unit area not utilized for forming a functional transistor but hosting an intersection of a CPODE feature and an active region instead.

A gate contact 150A electrically connects a gate of the read-port pass-gate transistor R-PG (formed by the gate structure 118) to the read-port word line node (R_WL). A gate contact 150C electrically connects a gate of the write-port pass-gate transistor PG-1 (formed by the gate structure 112) to the write-port word line node (W_WL). A gate contact 150D electrically connects a gate of the write-port pass-gate transistor PG-2 (formed by the gate structure 120) to the write-port word line node (W_WL). A gate contact 150E electrically connects a gate of the write-port pull-down transistor PD-1 (formed by the gate structure 114) and a gate of the write-port pull-up transistor PU-1 (also formed by the gate structure 114) to the storage node (SN). A gate contact 150F electrically connects a gate of the write-port pull-down transistor PD-2 (formed by the gate structure 116) and a gate of the write-port pull-up transistor PU-2 (also formed by the gate structure 116) to the complementary storage node (SNB).

A source/drain contact 160A and a source/drain contact via 170A landing thereon electrically connect a source region of the read-port pass-gate transistor R-PG to the read-port bit line node (R_BL). A source/drain contact 160B lands on a source/drain region and stays electrically floating, as there is no corresponding source/drain contact via landing thereon. A source/drain contact 160C and a source/drain contact via 170C landing thereon electrically connect a source region of the write-port pass-gate transistor PG-1 to the write-port complementary bit line node (W_BLB). A source/drain contact 160D and a source/drain contact via 170D landing thereon electrically connect a source region of the write-port pass-gate transistor PG-2 to the write-port bit line node (W_BL). A source/drain contact 160E and a source/drain contact via 170E landing thereon electrically connect a common drain region of the write-port pass-gate transistor PG-1 and the write-port pull-down transistor PD-1 together with a drain region of the write-port pull-up transistor PU-1 to the complementary storage node (SNB). A source/drain contact 160F and a source/drain contact via 170F landing thereon electrically connect a common drain region of the write-port pass-gate transistor PG-2 and the write-port pull-down transistor PD-2 together with a common drain region of the write-port pull-up transistor PU-2 and the read-port pass-gate transistor R-PG to the storage node (SN). A source/drain contact 160G and a source/drain contact via 170G landing thereon electrically connect a common source region of the write-port pull-down transistor PD-1 and the write-port pull-down transistor PD-2 to the electrical ground node VSS. A source/drain contact 160H and a source/drain contact via 170H landing thereon electrically connect a common source region of the write-port pull-up transistor PU-1 and the write-port pull-up transistor PU-2 to the power voltage node VDD. In the illustrated embodiment, the source/drain contacts 160A-160H each are elongated and have a longitudinal direction in the Y-direction, which is parallel to the extending directions of gate structures.

The storage node SN includes the gate contact 150E and the source/drain contact via 170F positioned on two opposing sides of the gate structure 116. As to discuss in further detail below, a metal line at the M0 level extends in the X-direction to across the gate structure 116 and connects the gate contact 150E and the source/drain contact via 170F. In other words, an M0 metal line hangs over the gate structure 116 and provide the function of cross coupling between the gate contact 150E and the source/drain contact via 170F. Therefore, in the layout 400, the gate contact 150E and the source/drain contact via 170F are positioned as being level in the Y-direction, such that a metal line extending in the X-direction may connect both. Similarly, the complementary storage node (storage node bar) SNB includes the gate contact 150F and the source/drain contact via 170E positioned on two opposing sides of the gate structure 114. As to discuss in further detail below, another metal line at the M0 level extends in the X-direction to across the gate structure 114 and connects the gate contact 150F and the source/drain contact via 170E. In other words, another M0 metal line hangs over the gate structure 114 and provide the function of cross coupling between the gate contact 150F and the source/drain contact via 170E. Therefore, in the layout 400, the gate contact 150F and the source/drain contact via 170E are positioned as being level in the Y-direction, such that a metal line extending in the X-direction may connect both.

FIG. 13 illustrates the V0 level and M0 level of the layout 400 of the metal interconnect structures of the two-port SRAM cell 100. At the M0 level, the SRAM cell 100 includes a plurality of metal tracks arranged in parallel. Particularly, in the illustrated embodiment of the layout 400, the SRAM cell 100 includes six metal tracks arranged in order from first (M0 Track 1) to sixth (M0 Track 6) along the Y-direction. The center lines of the metal tracks are represented by the dotted lines in FIG. 13.

In the layout 400, the first metal track "M0 Track 1" includes a global metal line 480A, which is a VSS line electrically coupled to the source/drain contact via 170G. The VSS line 480A is disposed on an upper edge of the SRAM cell 100 and may be shared with an adjacent SRAM cell. The second metal track "M0 Track 2" includes a local metal line 480B as a landing pad for the write-port word line (W_WL). The local metal line 480B is fully within the SRAM cell 100 and electrically connects to the gate contact 150C and the gate contact 150D. The third metal track "M0 Track 3" includes three local metal lines 480C, 480D, and 480E. The local metal line 480C provides a landing pad for the write-port complimentary bit line (W_BLB). The local metal line 480C extends beyond a left edge of the SRAM cell 100 and may be shared with an adjacent SRAM cell. The local metal line 480D is fully within the SRAM cell 100, which belongs to the storage node (SN) and provides cross-coupling between the gate contact 150E and the source/drain contact via 170F. As discussed above, the local metal line 480D crosses over the gate structure 116. The local metal line 480E provides a landing pad for the write-port bit line (W_BL). The local metal line 480E extends beyond a right edge of the SRAM cell 100 and may be shared with an adjacent SRAM cell. The fourth metal track "M0 Track 4" includes two local metal lines 480F and 480G. The local metal line 480F is fully within the SRAM cell 100 and is electrically floating. Therefore, the local metal line 480F is a non-functional metal line, which is mainly for improving metal density uniformity in the layout. The local metal line 480G is fully within the SRAM cell 100 and provides a landing pad for the read-port word line (R_WL). The fifth metal track "M0 Track 5" includes three local metal lines 480H, 480I, and 480J. The local metal line 480H extends beyond a left edge of the SRAM cell 100 and may be shared with an adjacent SRAM cell. The local metal line 480H is electrically floating. Therefore, the local metal line 480H is a non-functional metal line, which is mainly for improving metal density uniformity in the layout. The local metal line 480I is fully within the SRAM cell 100, which belongs to the complementary storage node (SNB) and provides cross-coupling between the gate contact 150F and the source/drain contact via 170E. As discussed above, the local metal line 480I crosses over the gate structure 116. The local metal line 480J extends beyond a right edge of the SRAM cell 100 and may be shared with an adjacent SRAM cell. The local metal line 480J provides a landing pad for the read-port bit line (R_BL). The sixth metal track "M0 Track 6" includes a global metal line 480K, which is a VDD line electrically coupled to the source/drain contact via 170H.

The VDD line 480K is disposed on a lower edge of the SRAM cell 100 and may be shared with an adjacent SRAM cell.

A width of the VSS line 480A is denoted as Wa with one half of Wa in one SRAM cell and another half of Wa in the adjacent SRAM cell. A width of the VDD line 480K may be substantially the same as the VSS line 480A with one half of Wa in one SRAM cell and another half of Wa in the adjacent SRAM cell. The other M0 metal lines 480B-480J may each have the same width denoted as Wb. The spacing between two adjacent M0 metal lines may be uniform and denoted as S1. Thus, the SRAM cell height H equals Wa+4*Wb+5*S1. Compared with the layout 200 of the single-port SRAM cell 50 that has a cell height H corresponding to eleven M0 metal tracks, the layout 400 of the two-port SRAM cell 100 has a cell height H corresponding to six metal tracks. Thus, the two-port SRAM cell 100 and the logic cell as shown in FIG. 6 may have the same cell height (H=CH), allowing each two-port SRAM cell 100 to directly abut a single logic cell.

Figure 14:
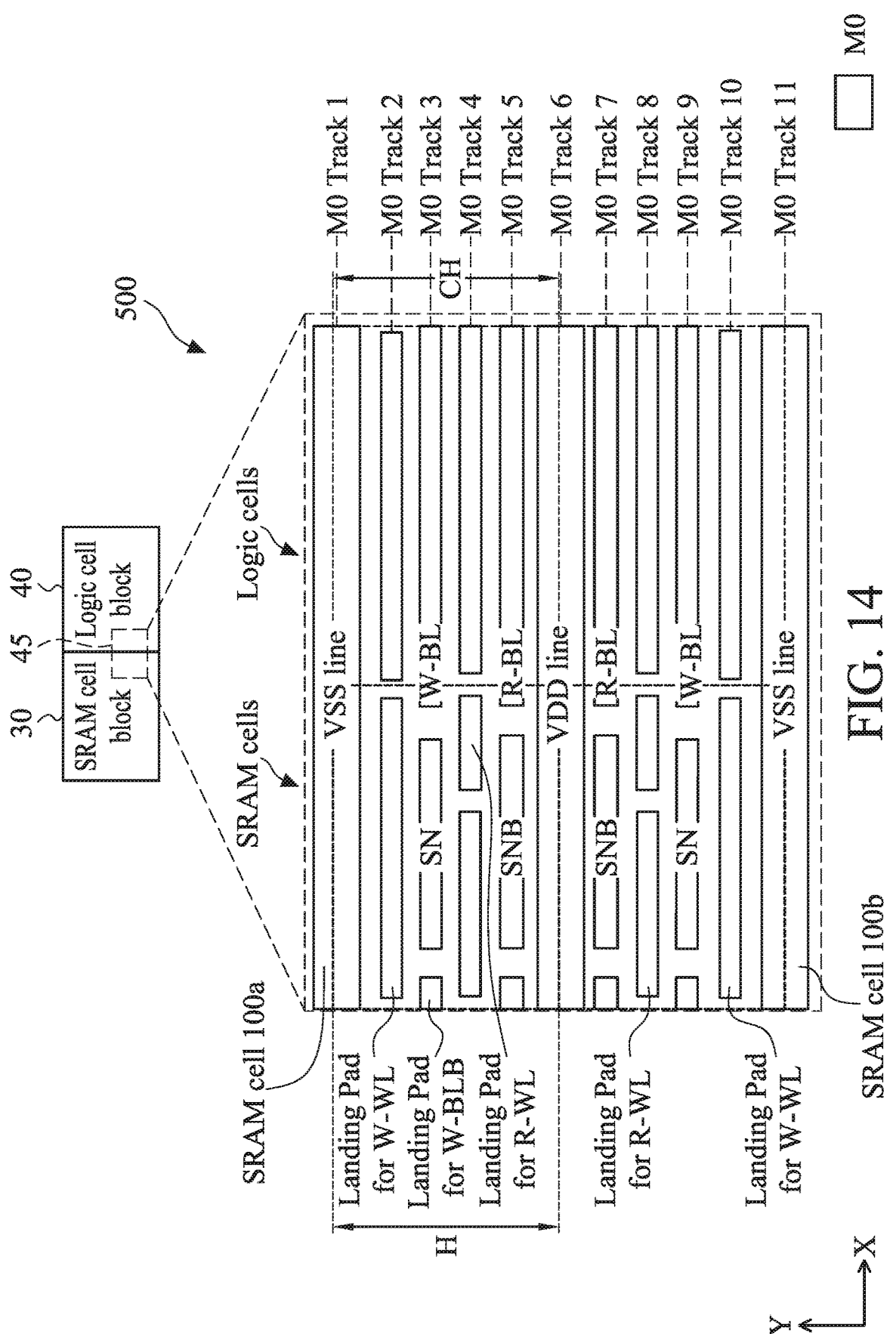
FIG. 14 illustrates a layout of a metal layer of a portion of the memory macro as in FIG. 1, in accordance with some embodiments of the present disclosure.

FIG. 14 illustrates the M0 level of a layout 500 of the circuit region 45 in the macro 20 (FIG. 1), which includes a portion of the SRAM cell block 30 and a portion of the logic cell block 40 and extends across an interface between the SRAM cell block 30 and the logic cell block 40. As discussed above, the two-port SRAM cell 100 and the logic cell may have the same cell height (H=CH). FIG. 14 depicts a column of two SRAM cells, in which a first SRAM cell 100*a* abutting a first logic cell and a second SRAM cell 100*b* abutting a second logic cell.

The metal tracks in the SRAM cells are aligned with the metal tracks in the logic cell block 40, allowing the metal lines in the logic cells to extend into the SRAM cells. Thus, there is no need for edge cells between the SRAM cell block 30 and the logic cell block 40 to provide metal transitions for the metal lines at the M0 level. The M0 Track 1 includes a VSS line extending through the first SRAM cell and the first logic cell. The M0 Track 2 includes a landing pad for W-WL inside the first SRAM cell and a signal line inside the first logic cell. The M0 Track 3 includes a landing pad for W-BLB, a local metal line for SN, and a metal line as the W-BL in the first logic cell that extends into the first SRAM cell and merges with the landing pad for W-BL. The M0 Track 4 includes a landing pad for R-WL inside the first SRAM cell and a signal line inside the first logic cell. The M0 Track 5 includes the local metal line for SNB in the first SRAM cell and a metal line as the R-BL in the first logic cell that extends into the first SRAM cell and merges with the landing port for R-BL. The M0 Track 6 includes a VDD line extending through the first/second SRAM cells and first/second logic cells. The M0 Track 7 includes the local metal line for SNB in the second SRAM cell and a metal line as the R-BL in the second logic cell that extends into the second SRAM cell and merges with the landing pad for R-BL. The M0 Track 8 includes a landing pad for R-WL inside the second SRAM cell and a signal line inside the second logic cell. The M0 Track 9 includes a local metal line for SN in the second SRAM cell and a metal line as the W-BL in the second logic cell that extends into the second SRAM cell and merges with the landing port for W-BL. The M0 Track 10 includes a landing pad for W-WL inside the second SRAM cell and a signal line inside the second logic cell. The M0 Track 11 includes a VSS line extending through the second SRAM cell and the second logic cell.

Figure 15:
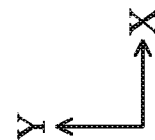
FIGS. 15 and 16 illustrates an alternative layout including device layer and metal layer of the two-port SRAM cell as in FIG. 11, in accordance with some embodiments of the present disclosure.
Figure 16:
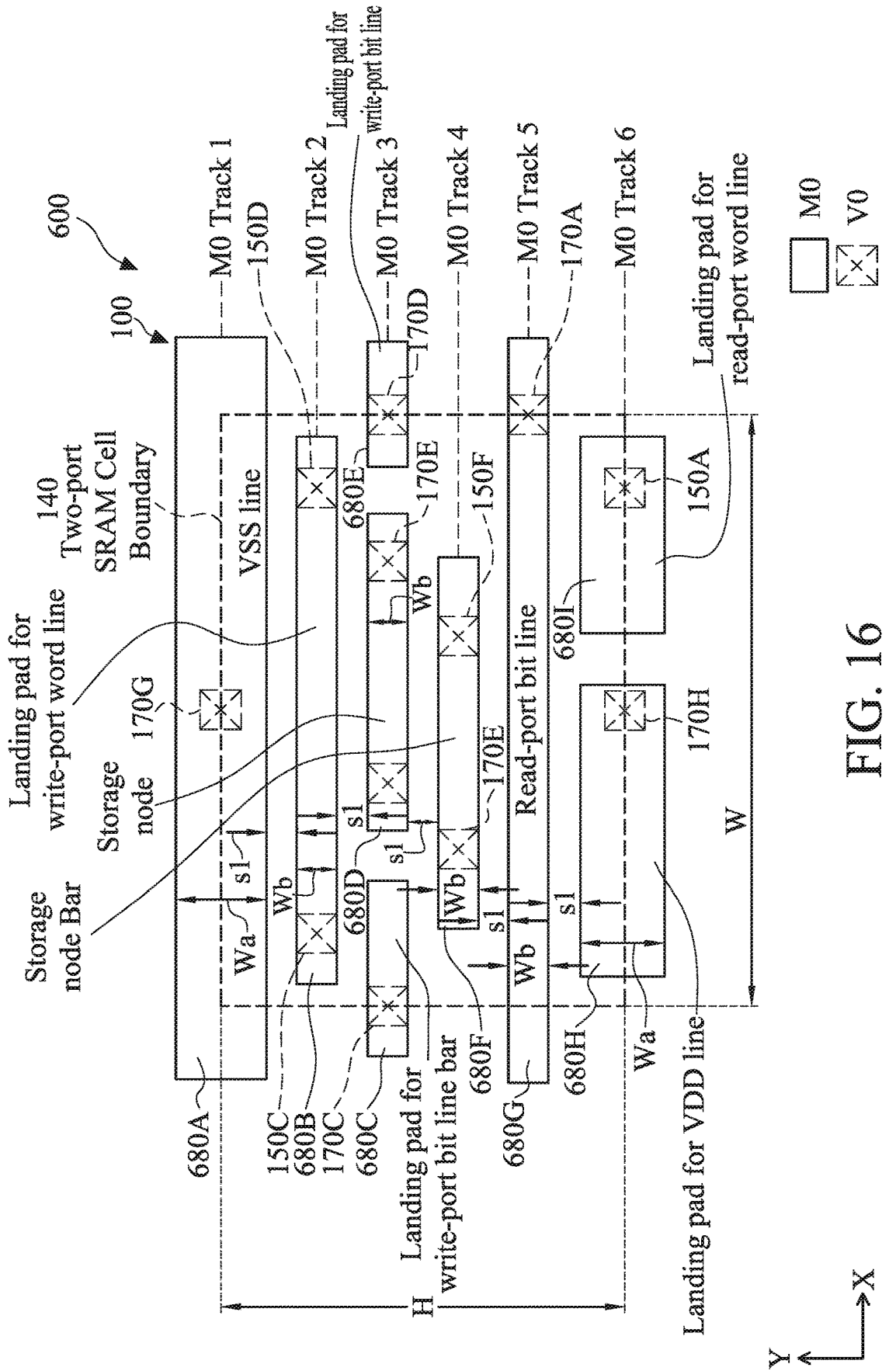

FIGS. 15 and 16 illustrate an alternative layout 600 of the SRAM cell 100 as in FIG. 11, in which FIG. 15 illustrates the DL level, C0 level, and V0 level of the layout 600 and FIG. 16 illustrates V0 level and M0 level of the layout 600.

The two-port SRAM cell 100 includes active regions 102 and 104. The active regions 102, 104 each extend lengthwise in the X-direction in FIG. 15. The active region 102 are a components of the write-port 100W, and the active region 104 has a side portion as a component of the read-port 100R and rest portion as a component of the write-port 100W. In other words, the active region 104 is shared by the read-port 100R and the write-port 100W. In the illustrated embodiment, the active region 104 belong to the transistors PU-1, PU-2, R-PG, which are PMOS devices. As such, the active region 104 is formed over an n-well. Meanwhile, the active region 102 belongs to the transistors PG-1, PD-1, PD-2, PG-2, which are NMOS devices. As such, the active region 102 is formed over a p-well (or a p-type substrate).

The two-port SRAM cell 100 further includes gate structures 112, 114, 116, 118, and 120. The gate structures 112-120 each extend lengthwise in the Y-direction. The gate structures 112, 114, 116, and 120 are components of the write-port 100W. The gate structure 118 is a component of the read-port 100R. The gate structures 114, 116 each extend through the two active regions 102, 104. As such, the gate structure 114 is shared by the transistors PD-1 and PU-1, and the gate structure 116 is shared by the transistors PD-2 and PU-2.

A boundary 140 of the two-port SRAM cell 100 is illustrated using broken lines. Note that some of the active regions and gate structures may extend beyond the illustrated boundary 140, since these active regions and gate structures may also form components of other adjacently located SRAM cells as well. For example, the gate structure 118 extends beyond the boundary 140 as shown in FIG. 15. The boundary 140 is longer in the X-direction than in the Y-direction. In other words, the boundary 140 may be rectangular. The first dimension of the boundary 140 along the X-direction is denoted as a cell width W, and the second dimension of the boundary 140 along the Y-direction is denoted as a cell height H. Where the two-port SRAM cell 100 is repeated in a memory array, the cell width W may represent and be referred to as a memory cell pitch in the memory array along the X-direction, and the cell height H may represent and be referred to as a memory cell pitch in the memory array along the Y-direction.

A gate contact 150A electrically connects a gate of the read-port pass-gate transistor R-PG (formed by the gate structure 118) to the read-port word line node (R_WL). A gate contact 150C electrically connects a gate of the write-port pass-gate transistor PG-1 (formed by the gate structure 112) to the write-port word line node (W_WL). A gate contact 150D electrically connects a gate of the write-port pass-gate transistor PG-2 (formed by the gate structure 120) to the write-port word line node (W_WL). A gate contact 150E electrically connects a gate of the write-port pull-down transistor PD-1 (formed by the gate structure 114) and a gate of the write-port pull-up transistor PU-1 (also formed by the gate structure 114) to the storage node (SN). A gate contact 150F electrically connects a gate of the write-port pull-down transistor PD-2 (formed by the gate structure 116) and a gate of the write-port pull-up transistor PU-2 (also formed by the gate structure 116) to the complementary storage node (SNB).

A source/drain contact 160A and a source/drain contact via 170A landing thereon electrically connect a source region of the read-port pass-gate transistor R-PG to the read-port bit line node (R_BL). A source/drain contact 160B lands on a source/drain region adjacent to the CPODE feature 132 and stays electrically floating, as there is no corresponding source/drain contact via landing thereon. A source/drain contact 160C and a source/drain contact via 170C landing thereon electrically connect a source region of the write-port pass-gate transistor PG-1 to the write-port complementary bit line node (W_BLB). A source/drain contact 160D and a source/drain contact via 170D landing thereon electrically connect a source region of the write-port pass-gate transistor PG-2 to the write-port bit line node (W_BL). A source/drain contact 160E and a source/drain contact via 170E landing thereon electrically connect a common drain region of the write-port pass-gate transistor PG-1 and the write-port pull-down transistor PD-1 together with a drain region of the write-port pull-up transistor PU-1 to the complementary storage node (SNB). A source/drain contact 160F and a source/drain contact via 170F landing thereon electrically connect a common drain region of the write-port pass-gate transistor PG-2 and the write-port pull-down transistor PD-2 together with a common drain region of the write-port pull-up transistor PU-2 and the read-port pass-gate transistor R-PG to the storage node (SN). A source/drain contact 160G and a source/drain contact via 170G landing thereon electrically connect a common source region of the write-port pull-down transistor PD-1 and the write-port pull-down transistor PD-2 to the electrical ground node Vss. A source/drain contact 160H and a source/drain contact via 170H landing thereon electrically connect a common source region of the write-port pull-up transistor PU-1 and the write-port pull-up transistor PU-2 to the power voltage node VDD. In the illustrated embodiment, the source/drain contacts 160A-160H each are elongated and have a longitudinal direction in the Y-direction, which is parallel to the extending directions of gate structures.

The storage node SN includes the gate contact 150E and the source/drain contact via 170F positioned on two opposing sides of the gate structure 116. As to discuss in further detail below, a metal line at the M0 level extends in the X-direction to across the gate structure 116 and connects the gate contact 150E and the source/drain contact via 170F. In other words, an M0 metal line hangs over the gate structure 116 and provide the function of cross coupling between the gate contact 150E and the source/drain contact via 170F. Therefore, in the layout 600, the gate contact 150E and the source/drain contact via 170F are positioned as being level in the Y-direction, such that a metal line extending in the X-direction may connect both. Similarly, the complementary storage node (storage node bar) SNB includes the gate contact 150F and the source/drain contact via 170E positioned on two opposing sides of the gate structure 114. As to discuss in further detail below, another metal line at the M0 level extends in the X-direction to across the gate structure 114 and connects the gate contact 150F and the source/drain contact via 170E. In other words, another M0 metal line hangs over the gate structure 114 and provide the function of cross coupling between the gate contact 150F and the source/drain contact via 170E. Therefore, in the layout 600, the gate contact 150F and the source/drain contact via 170E are positioned as being level in the Y-direction, such that a metal line extending in the X-direction may connect both.

On difference among the layout 600 as depicted in FIG. 15 and the layout 400 as depicted in FIG. 12 is: in the layout 600, the gate structure 118 for the transistor R-PG extends along the Y-direction across the boundary between the SRAM cell 100 and an adjacent SRAM cell, which allows the gate contact 150A to be disposed on the lower edge of the SRAM cell 100.

FIG. 16 illustrates the V0 level and M0 level of the layout 600 of the metal interconnect structures of the two-port SRAM cell 100. At the M0 level, the SRAM cell 100 includes a plurality of metal tracks arranged in parallel. Particularly, in the illustrated embodiment of the layout 600, the SRAM cell 100 includes six metal tracks arranged in order from first (M0 Track 1) to sixth (M0 Track 6) along the Y-direction. The center lines of the metal tracks are represented by the dotted lines in FIG. 16.

In the layout 600, the first metal track "M0 Track 1" includes a global metal line 680A, which is a VSS line electrically coupled to the source/drain contact via 170G. The VSS line 680A is disposed on an upper edge of the SRAM cell 100 and may be shared with an adjacent SRAM cell. The second metal track "M0 Track 2" includes a local metal line 680B as a landing pad for the write-port word line (W_WL). The local metal line 680B is fully within the SRAM cell 100 and electrically connects to the gate contact 150C and the gate contact 150D. The third metal track "M0 Track 3" includes three local metal lines 680C, 680D, and 680E. The local metal line 680C provides a landing pad for the write-port complimentary bit line (W_BLB). The local metal line 680C extends beyond a left edge of the SRAM cell 100 and may be shared with an adjacent SRAM cell. The local metal line 680D is fully within the SRAM cell 100, which belongs to the storage node (SN) and provides cross-coupling between the gate contact 150E and the source/drain contact via 170F. As discussed above, the local metal line 680D crosses over the gate structure 116. The local metal line 680E provides a landing pad for the write-port bit line (W_BL). The local metal line 680E extends beyond a right edge of the SRAM cell 100 and may be shared with an adjacent SRAM cell. The fourth metal track "M0 Track 4" includes a local metal line 680F. The local metal line 680F is fully within the SRAM cell 100, which belongs to the complementary storage node (SNB) and provides cross-coupling between the gate contact 150F and the source/drain contact via 170E. As discussed above, the local metal line 680F crosses over the gate structure 116. The fifth metal track "M0 Track 5" includes a global metal line 680G, which is a read-port bit line (R_BL) and electrically couples to the source/drain contact via 170A. The sixth metal track "M0 Track 6" includes local metal lines 680H and 680I. The local metal line 680H provides a landing pad for VDD line, which is electrically coupled to the source/drain contact via 170H. The local metal line 680H is disposed on a lower edge of the SRAM cell 100 and may be shared with an adjacent SRAM cell. The local metal line 680I provides a landing pad for the read-port word line (R_WL), which is electrically coupled to the gate contact 150A. The local metal line 680I is disposed on a lower edge of the SRAM cell 100 and may be shared with an adjacent SRAM cell.

A width of the VSS line 680A is denoted as Wa with one half of Wa in one SRAM cell and another half of Wa in the adjacent SRAM cell. A width of the landing pad for the VDD line 680H and a width of the landing pad for the read-port word line 680I may be substantially the same as the VSS line 680A with one half of Wa in one SRAM cell and another half of Wa in the adjacent SRAM cell. The other M0 metal lines 680B-680G may each have the same width denoted as Wb. The spacing between two adjacent M0 metal lines may be uniform and denoted as s1. Thus, the SRAM cell height H equals Wa+4*Wb+5*S1. Compared with the layout 200 of the single-port SRAM cell 50 that has a cell height H corresponding to eleven M0 metal tracks, the layout 400 of the two-port SRAM cell 100 has a cell height H corresponding to six metal tracks. Thus, the two-port SRAM cell 100 and the logic cell as shown in FIG. 6 may have the same cell height (H=CH), allowing each single two-port SRAM cell 100 to directly abut a corresponding logic cell.

Figure 17:
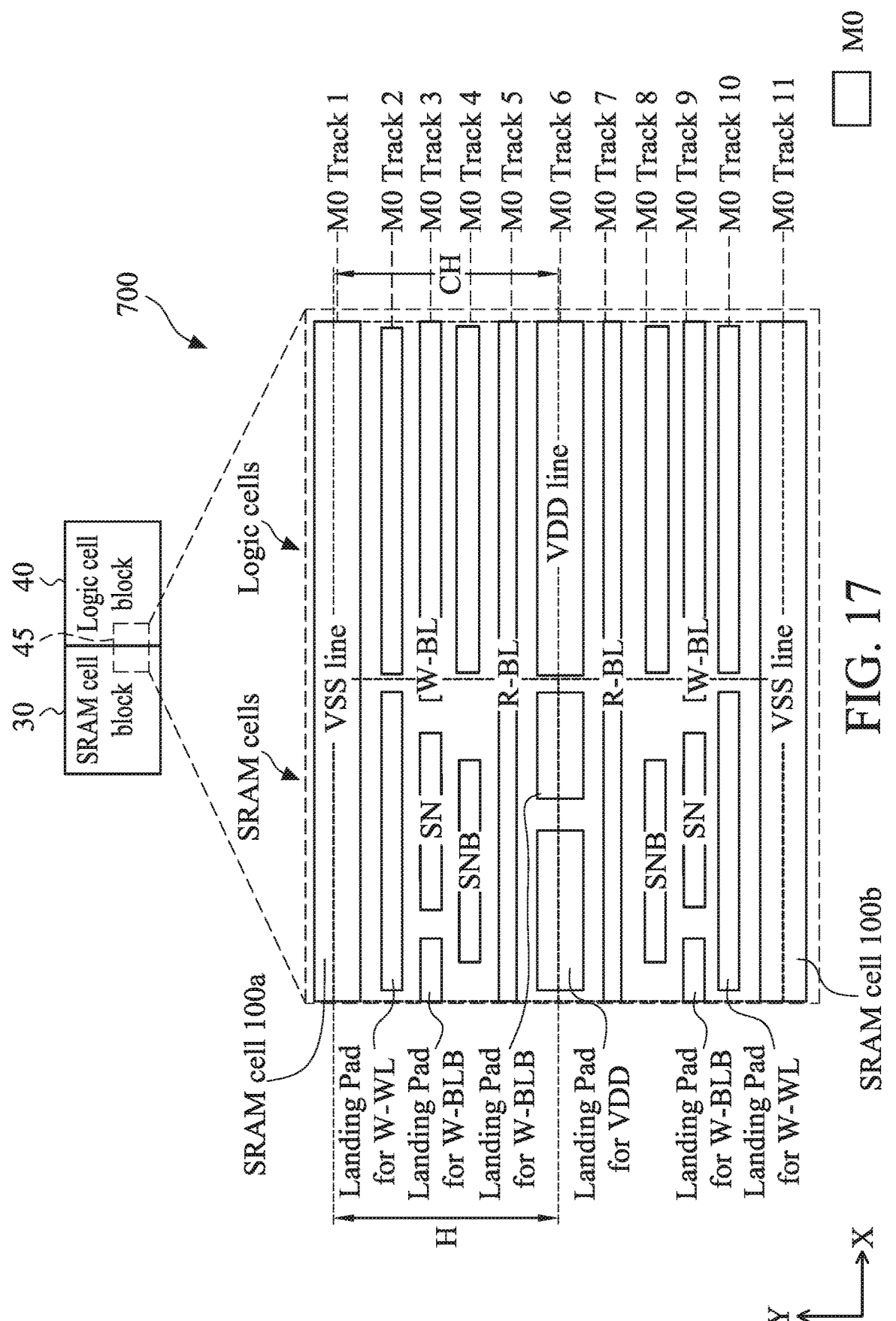
FIG. 17 illustrates an alternative layout of a metal layer of a portion of the memory macro as in FIG. 1, in accordance with some embodiments of the present disclosure.

FIG. 17 illustrates the M0 level of a layout 700 of the circuit region 45 in the macro 20 (FIG. 1), which includes a portion of the SRAM cell block 30 and a portion of the logic cell block 40 and extends across an interface between the SRAM cell block 30 and the logic cell block 40. As discussed above, the two-port SRAM cell 100 and the logic cell may have the same cell height (H=CH). FIG. 17 depicts a column of two SRAM cells, in which a first SRAM cell 100*a* abutting a first logic cell and a second SRAM cell 100*b* abutting a second logic cell.

The metal tracks in the SRAM cells are aligned with the metal tracks in the logic cell block 40, allowing the metal lines in the logic cells to extend into the SRAM cells. Thus, there is no need for edge cells between the SRAM cell block 30 and the logic cell block 40 to provide metal transitions for the metal lines at the M0 level. The M0 Track 1 includes a VSS line extending through the first SRAM cell and the first logic cell. The M0 Track 2 includes a landing pad for W-WL inside the first SRAM cell and a metal line as a signal line inside the first logic cell. The M0 Track 3 includes a landing pad for W-BLB, a local metal line for SN, and a metal line as the W-BL in the first logic cell that extends into the first SRAM cell and merges with the landing pad for W-BL. The M0 Track 4 includes the local metal line for SNB in the first SRAM cell and a metal line as a signal line inside the first logic cell. The M0 Track 5 includes a metal line as R-BL extending through the first SRAM cell and the first logic cell. The M0 Track 6 includes a landing pad for VDD, a landing pad for R-WL, and a meta line as the VDD line inside the logic cells. The M0 Track 7 includes a metal line as R-BL extending through the second SRAM cell and the second logic cell. The M0 Track 8 includes the local metal line for SNB in the second SRAM cell and a metal line as a signal line inside the second logic cell. The M0 Track 9 includes a landing pad for W-BLB, a local metal line for SN, and a metal line as the W-BL in the second logic cell that extends into the second SRAM cell and merges with the landing pad for W-BL. The M0 Track 10 includes a landing pad for W-WL inside the second SRAM cell and a metal line as a signal line inside the second logic cell. M0 Track 11 includes a VSS line extending through the second SRAM cell and the second logic cell.

Based on the above discussions, it can be seen that the present disclosure offers advantages over conventional semiconductor structures. It is understood, however, that other embodiments may offer additional advantages, and not all advantages are necessarily disclosed herein, and that no particular advantage is required for all embodiments. For example, the present disclosure provides a memory macro that allows the memory cell block and the logic cell abutting to each other and having metal tracks (and metal lines) aligned. Edge cells conventionally inserted between the memory cell block and the logic cell block may not be further needed. A memory macro area may be reduced by over 40% in some embodiments. Further, metal line alignment allows signal lines (such as bit line and/or bit line bar), as well voltage lines (such as VDD line and/or VSS line) to continuously extend through the memory cells and logic cells, which reduces resistance and parasitic capacitance and improves circuit performance.

In one exemplary aspect, the present disclosure is directed to a semiconductor structure. The semiconductor structure includes a memory cell connected to a bit line, a bit line bar, a first voltage line for receiving a power supply voltage, and a second voltage line for receiving an electric ground voltage, one or more logic cells configured to provide logic function to the memory cell, and an interconnect structure disposed over the memory cell and the one or more logic cells. The interconnect structure includes the bit line, the bit line bar, the first voltage line, and the second voltage line located in a same metal line layer of the interconnect structure, at least one of the bit line and the bit line bar extends from inside a boundary of the one or more logic cells and into a boundary of the memory cell, and at least one of the first and second voltage lines extends from inside the boundary of the one or more logic cells and into the boundary of the memory cell. In some embodiments, the memory cell is a static random-access memory (SRAM) cell. In some embodiments, the boundary of the memory cell directly abuts the boundary of the one or more logic cells. In some embodiments, the bit line fully extends through the memory cell. In some embodiments, the bit line bar fully extends through the memory cell. In some embodiments, the first voltage line fully extends through the memory cell. In some embodiments, the second voltage line fully extends through the memory cell. In some embodiments, the first voltage line has a uniform width inside the boundary of the one or more logic cells and a varied width inside the boundary of the memory cell. In some embodiments, the interconnect structure includes a metal line located in the metal line layer, the metal line extends from inside the boundary of the one or more logic cells and into the boundary of the memory cell, and the metal line is a functional line for the one or more logic cells and a non-functional line for the memory cell. In some embodiments, the metal line layer includes a plurality of metal tracks inside the boundary of the one or more logic cells, the first voltage line is located in a center one of the plurality of metal tracks, and the bit line and the bit line bar are evenly spaced from the first voltage line. In some embodiments, a number of the plurality of metal tracks inside the boundary of the one or more logic cells is an odd number.

In another exemplary aspect, the present disclosure is directed to a semiconductor structure. The semiconductor structure includes a memory cell, a logic cell abutting the memory cell, and an interconnect structure disposed over the memory cell and the logic cell. The interconnect structure includes a bottommost metal line layer that includes a first signal line, a second signal line, a power supply line, and an electric ground line, the first signal line extends from the logic cell and into the memory cell, the second signal line remains within the logic cell, and the electric ground line extends from the logic cell and into the memory cell. In some embodiments, the first signal line is a bit line. In some embodiments, the first signal line fully extends through the memory cell. In some embodiments, the first signal line merges with a landing pad for the bit line in the memory cell. In some embodiments, the electric ground line fully extends through the memory cell. In some embodiments, the power supply line extends from the logic cell and fully extends through the memory cell.

In yet another exemplary aspect, the present disclosure is directed to a semiconductor structure. The semiconductor structure includes a memory cell having a plurality of first metal tracks in parallel, and one or more logic cells having a plurality of second metal tracks in parallel. Each of the first metal tracks is aligned with one of the second metal tracks, a number of the second metal tracks is an odd number, and a center one of the second metal tracks is a power supply line that extends through the memory cell. In some embodiments, the second metal tracks include a first signal line and a second signal line each extend through the memory cell. In some embodiments, the power supply line is positioned between the first and second signal lines, and the first and second signal lines are evenly spaced from the power supply line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a memory cell electrically coupled to a bit line, a bit line bar, a first voltage line for receiving a power supply voltage, and a second voltage line for receiving an electric ground voltage;
one or more logic cells configured to provide logic function to the memory cell, the memory cell spaced apart from the one or more logic cells along a first direction; and
an interconnect structure disposed over the memory cell and the one or more logic cells,
wherein:
the interconnect structure includes the bit line, the bit line bar, the first voltage line, the second voltage line, and a pad all located in a same metal line layer of the interconnect structure,
at least one of the bit line and the bit line bar extends from inside a boundary of the one or more logic cells and into a boundary of the memory cell,
one of the first and second voltage lines extends from inside the boundary of the one or more logic cells and through the boundary of the memory cell,
another one of the first and second voltage lines is aligned with the pad along the first direction and electrically coupled to the pad, and
when viewed from top the pad overlaps with the memory cell.

2. The semiconductor structure of claim 1, wherein the memory cell is a static random-access memory (SRAM) cell.

3. The semiconductor structure of claim 1, wherein the boundary of the memory cell directly abuts the boundary of the one or more logic cells.

4. The semiconductor structure of claim 1, wherein the bit line fully extends through the memory cell.

5. The semiconductor structure of claim 4, wherein the bit line bar fully extends through the memory cell.

6. The semiconductor structure of claim 1, wherein the first voltage line fully extends through the memory cell.

7. The semiconductor structure of claim 6, wherein the second voltage line fully extends through the memory cell.

8. The semiconductor structure of claim 6, wherein the first voltage line has a uniform width inside the boundary of the one or more logic cells and a varied width inside the boundary of the memory cell.

9. The semiconductor structure of claim 1, wherein the interconnect structure includes a metal line located in the metal line layer, the metal line extends from inside the boundary of the one or more logic cells and into the boundary of the memory cell, and the metal line is functional for the one or more logic cells and non-functional for the memory cell.

10. The semiconductor structure of claim 1, wherein the metal line layer includes a plurality of metal tracks inside the boundary of the one or more logic cells, wherein the first voltage line is located in a center one of the plurality of metal tracks, and the bit line and the bit line bar are evenly spaced from the first voltage line.

11. The semiconductor structure of claim 10, wherein a number of the plurality of metal tracks inside the boundary of the one or more logic cells is an odd number.

12. A semiconductor structure, comprising:
a memory cell;
a logic cell abutting the memory cell along a first direction; and
an interconnect structure disposed over the memory cell and the logic cell,
wherein:
the interconnect structure includes a bottommost metal line layer that includes a first signal line, a second signal line, a power supply line, and an electric ground line,
the first signal line extends from the logic cell and through the memory cell as a straight line along the first direction and maintaining within the bottommost metal line layer,
the second signal line remains within the logic cell, and
the electric ground line extends from the logic cell and into the memory cell.

13. The semiconductor structure of claim 12, wherein the first signal line is a bit line.

14. The semiconductor structure of claim 13, wherein the first signal line fully extends through the memory cell.

15. The semiconductor structure of claim 13, wherein the first signal line merges with a landing pad for the bit line in the memory cell.

16. The semiconductor structure of claim 12, wherein the electric ground line fully extends through the memory cell.

17. The semiconductor structure of claim 12, wherein the power supply line extends from the logic cell and fully extends through the memory cell.

18. A semiconductor structure, comprising:
a memory cell having a plurality of first metal tracks in parallel and spaced apart along a first direction; and
two logic cells abutting each other along the first direction, the two logic cells having a plurality of second metal tracks in parallel and spaced apart along the first direction,
wherein:
each of the first metal tracks is aligned with one of the second metal tracks,
a total number of the second metal tracks is an odd number,
counting along the first direction in sequence the second metal tracks include a first one of the second metal tracks that is an electric ground line and a center one of the second metal tracks that is a power supply line extending through the memory cell, and
a total number of the second metal tracks sandwiched between the electric ground line and the power supply line is an even number.

19. The semiconductor structure of claim 18, wherein the second metal tracks include a first signal line and a second signal line each extend through the memory cell.

20. The semiconductor structure of claim 19, wherein the power supply line is positioned between the first and second signal lines, and the first and second signal lines are evenly spaced from the power supply line.

\* \* \* \* \*